United States Patent
Kobayashi et al.

(10) Patent No.: US 7,965,150 B2
(45) Date of Patent: Jun. 21, 2011

(54) DIFFERENTIAL OSCILLATION APPARATUS AND MODULATOR

(75) Inventors: Shigeru Kobayashi, Tokyo (JP); Suguru Fujita, Tokyo (JP)

(73) Assignee: Panasonic Corporation, Osaka (JP)

( * ) Notice: Subject to any disclaimer, the term of this patent is extended or adjusted under 35 U.S.C. 154(b) by 275 days.

(21) Appl. No.: 12/303,727

(22) PCT Filed: May 23, 2007

(86) PCT No.: PCT/JP2007/060539
§ 371 (c)(1),
(2), (4) Date: Dec. 6, 2008

(87) PCT Pub. No.: WO2007/142035
PCT Pub. Date: Dec. 13, 2007

(65) Prior Publication Data
US 2010/0237957 A1    Sep. 23, 2010

(30) Foreign Application Priority Data

Jun. 8, 2006  (JP) .................................. 2006-159455
May 9, 2007  (JP) .................................. 2007-124720

(51) Int. Cl.
*H03L 5/00* (2006.01)
*H03L 1/00* (2006.01)
(52) U.S. Cl. .......................... 331/185; 331/167; 332/106
(58) Field of Classification Search ................. 331/17, 331/167, 185; 332/106
See application file for complete search history.

(56) References Cited

U.S. PATENT DOCUMENTS 7,667,550 B2 *  2/2010  Palma ............................ 331/185
2005/0179503 A1   8/2005  Shadwell

FOREIGN PATENT DOCUMENTS

| JP | 01-138804 A | 5/1989 |
| JP | 09-121231 A | 5/1997 |
| JP | 2001-189625 A | 7/2001 |
| JP | 2005-049200 A | 2/2005 |
| JP | 2005-253069 A | 9/2005 |
| WO | 01/31784 A1 | 5/2001 |
| WO | 2005-117256 A1 | 12/2005 |

OTHER PUBLICATIONS

Teshirogi et al.: "Residual-carrier-free burst oscillator for automotive UWB radar applications" Electronics Letters vol. 41, No. 9. Apr. 28, 2005.
International Search Report for PCT/JP2007/060539.

* cited by examiner

*Primary Examiner* — Robert Pascal
*Assistant Examiner* — James E Goodley
(74) *Attorney, Agent, or Firm* — Pearne & Gordon LLP

(57) ABSTRACT

It is an object of the present invention to shorten a time required until phases of output signals being output from two output terminals are inverted respectively from a start time of an oscillation in a differential oscillation apparatus. In a differential oscillation apparatus according to the present invention which includes a differential oscillator portion 103 having an external input terminal at a terminal of one transistor 105 and a switch circuit 104, a first control signal generation circuit 101 for generating a first control signal to control an oscillation start and an oscillation stop of the differential oscillator portion 103, and a second control signal generation circuit 102 for generating a second control signal input into the terminal of one transistor 105 of the differential oscillator portion 103, when a phase relationship between collector currents flowing through two transistors 105, 106 is decided by the second control signal, output signals being output from two output terminals are opposite in phase from a start time of an oscillation.

27 Claims, 21 Drawing Sheets

DIFFERENTIAL OSCILLATION APPARATUS AND MODULATOR

TECHNICAL FIELD

The present invention relates to a differential oscillation apparatus whose delay time caused until respective phases of output signals output from two output terminals of a differential oscillator portion are inverted from a resonance that occurs at a frequency decided by a circuit constant is short.

BACKGROUND ART

As one of the UWB (Ultra Wide Band) technologies, the development of an equipment or system for holding communication or distance measurement by using a pulse signal is proceeding. In order to shape the pulse signal into an alternating signal that has only a component in a desired frequency band, roughly there are two methods. One is the method of limiting a frequency band of the pulse signal by a filter to extract a particular frequency band component only, and the other is the method of either extracting partially an alternating signal by placing a window intermittently on the alternating signal or operating an oscillator circuit serving as an alternating signal source intermittently to generate an oscillation itself intermittently.

As the method of multiplying the pulse signal by an alternating signal source (the method of extracting partially an alternating signal by placing a window intermittently on the alternating signal), it is common to modulate an output of the oscillator circuit and the pulse signal by using a mixer circuit, like a carrier communication. Also, as the method of operating the oscillator circuit intermittently, the method of operating the oscillator circuit intermittently by turning ON/OFF an electric current flowing through the oscillation circuit using a transistor by a switch has been proposed.

Also, the technology to operate differentially the oscillator circuit by using paired transistors is disclosed. A configuration in the technology is shown in FIG. 15. FIG. 15 is a block circuit diagram showing a configuration of the intermittent differential oscillation apparatus using the transistors in the prior art. This oscillator circuit is constructed by a differential oscillator portion 1605 that is composed of a current source switch 1601, transistors 1602, 1603, and a resonance circuit 1604, and a first control signal generation circuit 1606. The current source switch 1601 is operated intermittently by a control signal output from the first control signal generation circuit 1606. The differential oscillator portion 1605 oscillates in response to a voltage level and an applied period of the control signal being output from the first control signal generation circuit 1606 (see Patent Literature 1).

However, in the circuit configuration in the prior art, two transistors start the operation simultaneously in starting the operation of the differential oscillator portion 1605. Therefore, an infinitesimal delay time is caused until the oscillator circuit starts its differential operation after a resonance occurs at a frequency decided by a circuit constant.

Here, when a potential difference between two output terminals is output by operating the differential oscillator portion 1605 intermittently in unit of nanosecond, waveforms that are not in an opposite phase respectively are output from two terminals at a pulse rise time of the oscillation output due to occurrence of the infinitesimal delay time. Therefore, voltage oscillations between two output terminals of the differential oscillator portion 1605 are canceled or synthesized in a condition that they are not in phase with each other, and thus a large output amplitude cannot be obtained. As a result, the rising of the oscillation output is delayed and thus, when a pulse width is given in unit of nanosecond, in some cases the differential oscillator portion 1605 cannot generate the oscillation output with an intended time width.

In order to solve this problem, a configuration shown in FIG. 14 has been proposed. FIG. 14 is a block circuit diagram showing a configuration of an intermittent differential oscillation apparatus using transistors in the prior art. This oscillator circuit includes a current source 1501, a constant-voltage power supply 1502, a resonator 1503, a resonator 1504, transistors 1505 to 1508, and a control signal input terminal 1509. In this case, the transistor 1505 and the current source 1501 connected in series perform a function of the current source switch 1601 shown in FIG. 15. That is, when the current source switch 1601 shown in FIG. 15 is operated intermittently by a control signal that controls an intermittent operation, it fulfills a function equivalent to an intermittent operation of the transistor 1505. Also, the current source switch 1601 shown in FIG. 15 performs a function of a constant-current source similar to the current source 1501 shown in FIG. 14.

The intermittent operation is made based on a rectangular wave that is input from the control signal input terminal 1509 connected to a base terminal of the transistor 1505. In this case, when the intermittent operation is turned off, no current flows through the current source 1501 and a standby current flows through inductors between the constant-voltage power supply 1502 and the resonator 1503.

Then, as soon as a rectangular wave that is input into the transistor 1505 and the intermittent operation is turned on, the standby current is cut off and a ringing is caused in the circuit through the influence of this cut-off. The oscillator circuit is operated rapidly by this ringing as a trigger, and an output of a short pulse width from the oscillator circuit is obtained as an output signal (see Non-Patent Literature 1).

Patent Literature 1: JP-A-2005-49200
Non-Patent Literature 1: T. Teshirogi, et al.: 'Residual-carrier free burst oscillator for automotive UWB radar applications', IEE2005 Electrics Letters 28 Apr. 2005 Vol. 41, No. 9

DISCLOSURE OF THE INVENTION

Problems that the Invention is to Solve

However, in the above circuit configuration in the prior art, a large number of transistors are used to produce the ringing, and the problem lies in power consumption. Also, since the number of transistors on the current source side that controls a collector current of a cross differential oscillator circuit is large, a variation in a current value due to temperature is large and the temperature characteristic as the circuit is not good. Also, since two resonators are needed to keep the path that flows the standby current, the control of the frequency characteristic is needed.

The present invention has been made in view of the above problems in the prior art and it is an object of the present invention to provide a differential oscillation apparatus and a modulator, capable of shortening an infinitesimal delay time caused until phases of two outputs from an oscillator portion go to opposite phases respectively, not to deteriorate the temperature characteristic.

Means for Solving the Problems

In order to solve the problems in the prior art, a differential oscillation apparatus of the present invention includes a differential oscillator portion that contains a pair of transistors to at least one terminal of which an external input terminal is provided and a current source; a first control signal generator portion for generating a first control signal to control a start and a stop of the current source and outputting the first control signal to the current source; and a second control signal generator portion for generating a second control signal to control output currents of the transistors and outputting the second control signal to the external input terminal.

Accordingly, when the differential oscillation apparatus operates intermittently by inputting the first control signal being output from the first control signal generating circuit into the current source of the differential oscillation apparatus, the second control signal being output from the second control signal generating circuit is input into the terminal of one transistor constituting the differential oscillation apparatus. Therefore, the control signal whose polarity is opposite to that of the second control signal appears at the terminal of the other transistor. As a result, such an effect can be achieved that an infinitesimal delay time that is caused until the phases of two output signals of the differential oscillator portion go to an opposite phase respectively after the resonance occurs at a frequency decided by a circuit constant (referred to as a "differential operation delay time" hereinafter) can be reduced.

Also, in the differential oscillation apparatus of the present invention, the external input terminal is provided to a base of the transistor, and the second control signal generating portion outputs to control a base voltage of the transistor.

Accordingly, the second control signal is input as the voltage value to the base terminal of one transistor of the differential oscillation apparatus. Therefore, the voltage whose polarity is opposite to that of the second control signal appears at the collector terminal of the other transistor. As a result, such an effect can be achieved that an infinitesimal delay time in the differential oscillation can be reduced.

Also, in the differential oscillation apparatus of the present invention, the external input terminal is provided to a emitter terminal of the transistor, and the second control signal generating portion outputs a signal that controls collector currents of the transistors.

Accordingly, the second control signal is input as the current value to the emitter terminal of one transistor of the intermittent differential oscillation apparatus. Therefore, the current whose polarity is opposite to that of the second control signal appears at the emitter terminal of the other transistor. As a result, such an effect can be achieved that an infinitesimal delay time in the differential oscillation can be reduced.

Also, in the differential oscillation apparatus of the present invention, the second control signal is a signal that exists in a rising period of the first control signal.

Accordingly, when either a timing at which the first control signal is input into the current source switch portion coincides with a timing at which the second control signal is applied to the terminal of one transistor or the second control signal has already been applied, phases of the output signals of the differential oscillator portion can be adjusted from a start time of the oscillation.

Also, in the differential oscillation apparatus of the present invention, the first control signal is a signal that controls at least once or more a start and an end of an operation of the current source.

Accordingly, when only a start of the operation of the current source is controlled by the first control signal, this operation mode is effective in starting the mobile terminal from a sleep mode. When a start and an end of the operation of the current source is controlled by the first control signal, this operation mode is effective in shortening a rise time and a fall time of the modulation signal in the pulse communication, i.e., speeding up a communication speed.

Also, a modulator of the present invention, includes the differential oscillation apparatus of the present invention; and a transmitting signal generation circuit for generating a transmitting signal as transmission data, and outputting the transmitting signal to the first control signal generator portion and the second control signal generator portion; wherein the first control signal generator portion and the second control signal generator portion generate the first control signal and the second control signal in response to the transmitting signal respectively, and the differential oscillation apparatus outputs a modulated signal that is generated by modulating the transmitting signal.

Accordingly, because the control signal is input into the terminal of one transistor, the modulator whose infinitesimal delay time caused until the phases of outputs of two oscillator circuits of the differential oscillation apparatus are inverted respectively from a start time of the resonance is short can be constructed. Therefore, even when the output signal is obtained by giving a potential difference between two output terminals or even when the output signal is obtained by picking up the signals from the terminals respectively, a rising of the output signal of the differential oscillation apparatus is accelerated. As a result, the output signal whose pulse width is set in unit of nanosecond can be generated, and the high-speed modulator can be realized.

Also, a modulator of the present invention includes the differential oscillation apparatus; an output selection switch portion for selecting either of oscillation outputs having a different phase respectively from the differential oscillator portion; and a transmitting signal generator portion for generating a transmitting signal as transmission data, and outputting the transmitting signal to the output selection switch portion; wherein the output selection switch portion selects an oscillation output from the differential oscillator portion in response to the transmitting signal, and the differential oscillation apparatus outputs a modulated signal that is generated by modulating the transmitting signal.

Accordingly, the amplitude of the output signal can be controlled by the voltage value of the transmitting signal, and also the intermittent differential oscillation apparatus that is able to obtain the output signal whose infinitesimal delay time in the differential oscillation is short can be employed as the modulator.

Also, in the modulator of the present invention, the transmitting signal generating portion further outputs the transmitting signal to the first control signal generator portion and the second control signal generator portion.

Accordingly, such an effect can be achieved that the amplitude and the phase of the output signal can be controlled by the voltage value of the transmitting signal, the differential oscillation apparatus that is able to obtain the output signal whose infinitesimal delay time in the differential oscillation is short can be employed as the modulator, and the modulation signal can be handled by a multiple-valued logic.

Also, a differential oscillation apparatus of the present invention, which includes a differential oscillator portion that contains a first transistor and a second transistor, one terminals of which are connected in common and other two terminals of which are connected to cross each other and terminals of which connected in common are connected to a current source, and two output terminals, includes an external input terminal provided to a terminal of either of the first transistor and the second transistor; wherein a first control signal for controlling a start and an end of an operation of the current source is supplied to a terminal of the current source, and a second control signal for controlling a voltage between terminals of the first transistor and the second transistor is supplied to the external input terminal.

Accordingly, when the differential oscillation portion operated intermittently by inputting the first control signal to the current source, the second control signal is input into the external input terminal of one transistor constituting the differential oscillation portion, and also the control signal whose polarity is opposite to that of the second control signal appears at the terminal of the other transistor. Therefore, the differential oscillator portion can shorten the infinitesimal delay time that is caused until the phases of two output signals go to an opposite phase respectively from a start time of the resonance that occurs at the frequency decided by the circuit constant (the differential operation delay time). As a result, the reduction of the differential operation delay time can be implemented with the good temperature characteristic, in contrast to the technology in the prior art in which the differential operation delay time can be shortened by the circuit configuration in which the number of transistors is increased.

Also, a differential oscillation apparatus of the present invention, which includes a differential oscillator portion that contains a first transistor and a second transistor, one terminals of which are connected in common and other two terminals of which are connected to cross each other and terminals of which connected in common are connected to a current source, and two output terminals, includes a first external input terminal provided to any one of terminals of the first transistor; and a second external input terminal provided to any one of terminals of the second transistor; wherein a first control signal for controlling a start and an end of an operation of the current source is supplied to a terminal of the current source, a second control signal for controlling a voltage between terminals of the first transistor is supplied to the first external input terminal, and a third control signal for controlling a voltage between terminals of the second transistor is supplied to the second external input terminal.

Accordingly, when the differential oscillator portion is operated intermittently by inputting the first control signal into the current source, the second control signal is input into the first external input terminal of the first transistor constituting the differential oscillator portion, and also the third control signal is input into the second external input terminal of the second transistor. As a result, the differential operation delay time can be shortened not to worsen the temperature characteristic due to an increase in the number of transistors.

Advantages of the Invention

According to the differential oscillation apparatus of the present invention, in starting the intermittent operation by inputting a first control signal, a second control signal is input into the terminal of one transistor, and also a control signal whose polarity is opposite to that of the second control signal appears at the terminal of the other transistor. Therefore, an infinitesimal delay time caused until phases of two outputs from the differential oscillator portion go to opposite phases respectively from a start time of the oscillation can be shortened not to deteriorate the temperature characteristic due to an increase of the number of transistors.

Figure 1:
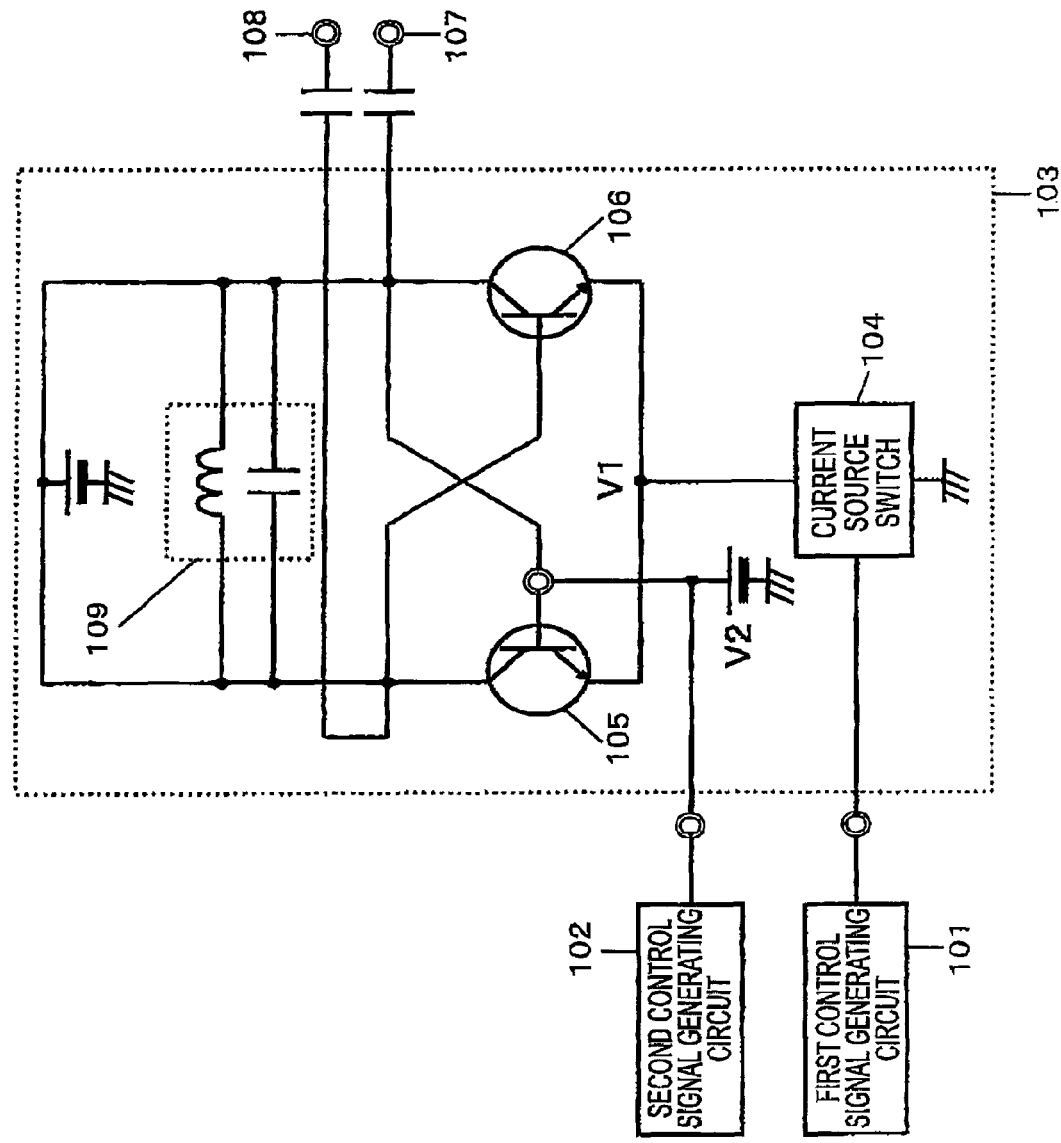
FIG. 1 A view showing a configuration of a differential oscillation apparatus in Embodiment 1 of the present invention.

DESCRIPTION OF REFERENCE NUMERALS 101, 602 first control signal generation circuit
102, 603 second control signal generation circuit
103 differential oscillator portion
104 current source switch
105, 106 transistor
107, 108 output terminal
109 resonance circuit
301 third control signal generation circuit
401 current/voltage converter circuit
601, 1001, 1201 transmitting signal generation circuit 604 control signal generating circuit group
801, 1003 driver circuit
802, 1004 amplifier circuit
803 voltage value control circuit
804 gate circuit
805 delay circuit
1002 output selection switch circuit
1005 output terminal
1202 comparator circuit
1203 OR gate circuit
1505, 1506, 1507, 1508 transistor
1501 current source
1502 constant-voltage power supply
1503, 1504 resonator
1509 control signal input terminal
1601 current source switch
1602 transistor
1603 transistor
1604 resonance circuit
1605 differential oscillator portion
1606 first control signal generation circuit
1701 resonance circuit

BEST MODE FOR CARRYING OUT THE INVENTION

Embodiments of the present invention will be explained with reference to the drawings hereinafter.

Embodiment 1

FIG. 1 is a view showing a configuration of a differential oscillation apparatus in Embodiment 1 of the present invention. In the present embodiment, the case where the differential oscillation apparatus is operated intermittently will be explained hereunder. The differential oscillation apparatus shown in FIG. 1 is constructed by a differential oscillator portion 103 consisting of a current source switch 104, transistors 105, 106, and a resonance circuit 109, a first control signal generation circuit 101, and a second control signal generation circuit 102.

The first control signal generation circuit 101 is connected to the current source switch 104. Also, the second control signal generation circuit 102 is connected to a base terminal of the transistor 105. Signals that the first control signal generation circuit 101 and the second control signal generation circuit 102 output are a rectangular wave, for example, respectively. Explanation will be made hereunder under the assumption that a control signal is a rectangular wave.

When the control signal is output from the first control signal generation circuit 101, the differential oscillation apparatus is operated intermittently. When the control signal is output from the second control signal generation circuit 102 is output to the base terminal of the transistor 105, the differential oscillation apparatus oscillates differentially from a time when the oscillation is started. Thus, output signals in an opposite phase respectively are output from two output terminals from the starting-up.

Figure 2:
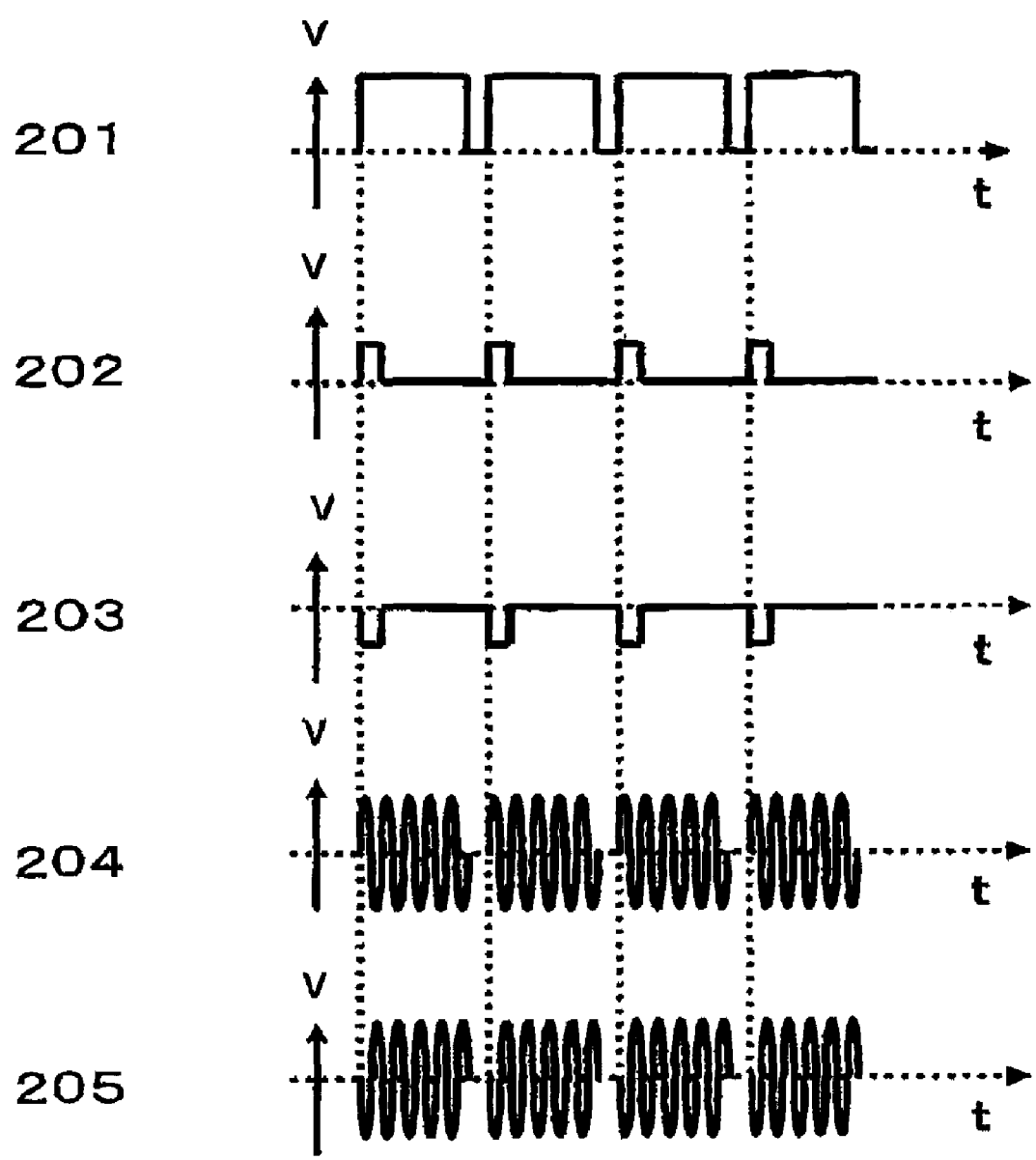
FIG. 2 A view showing control signal waveforms and output signal waveforms in Embodiment 1 of the present invention.

FIG. 2 shows a timing chart of control signals and output signals in the differential oscillation apparatus shown in FIG. 1. Then, the intermittent differential oscillation apparatus, which can generate a short pulse to cause the differential oscillation from a start time of oscillation, in Embodiment 1 of the present invention will be explained with reference to FIG. 1 and FIG. 2 hereunder.

The first control signal generation circuit 101 inputs a control signal 201 to the current source switch 104 of the differential oscillator portion 103. The current source switch 104 is operated intermittently by the control signal 201. The differential oscillator portion 103 oscillates in response to a voltage level and an applied period of the control signal 201.

The second control signal generation circuit 102 receives a control signal 202 at the base terminal of the transistor 105 in synchronism with a rising timing of the control signal 201. When the control signal 202 is input into the base terminal, an offset of a voltage V2 is applied to the transistor 105, as shown in FIG. 1. Thus, the voltage V2 is set as a voltage that is higher than a voltage V1 by almost a diode forward voltage (0.6 V to 0.7 V).

A voltage between base-emitter terminals of the transistor 105 is increased in a period in which the control signal 202 is input. Thus, a collector current of the transistor 105 is increased in this period. Because the differential oscillator portion 103 is composed of the cross differential circuit, a base voltage of the transistor 106 is varied by a voltage indicated in a signal 203 in response to the control signal 202. Thus, a phase of the differential oscillator portion 103 in starting the oscillation can be controlled.

In the differential oscillator portion 103, a collector current of the transistor 105 becomes larger than a collector current of the transistor 106 in a period in which the control signal 202 is applied to the base terminal of the transistor 105. Also, in the differential oscillator portion 103, when either a timing at which the control signal 201 is input into the current source switch 104 coincides with a timing at which the control signal 202 is applied to the base terminal of the transistor 105 or the control signal 202 has already been applied, phases of the collector currents of a pair of transistors can be decided from a start time of the oscillation. Therefore, since phases of output signals 204, 205 can be controlled in the differential oscillator portion 103, an infinitesimal delay time that is caused until the phases of two output signals 204, 205 of the differential oscillator portion 103 go to an opposite phase respectively after the resonance occurs at a frequency decided by a circuit constant (referred to as a "differential operation delay time" hereinafter) can be reduced.

As described above, output signals output from an output terminal 107 and an output terminal 108 are opposite in phase from a start time of the oscillation. Also, even when an output signal is obtained based on a potential difference between two output terminals, the differential oscillator portion 103 can obtain a large amplitude in such a way that voltage oscillations from two terminals are not canceled mutually in a start time of the oscillation. As a result, a rising of the output signal is accelerated, and thus the intermittent differential oscillation apparatus can generate the output signal whose pulse width is set in unit of nanosecond.

As shown in the above, because the control signal 202 is input into the base terminal of one transistor 105 of the differential oscillator portion 103, the differential operation delay time can be shortened. Therefore, the differential oscillation apparatus that can generate a short pulse used to produce the differential oscillation from a start time of the oscillation can be constructed.

Figure 3:
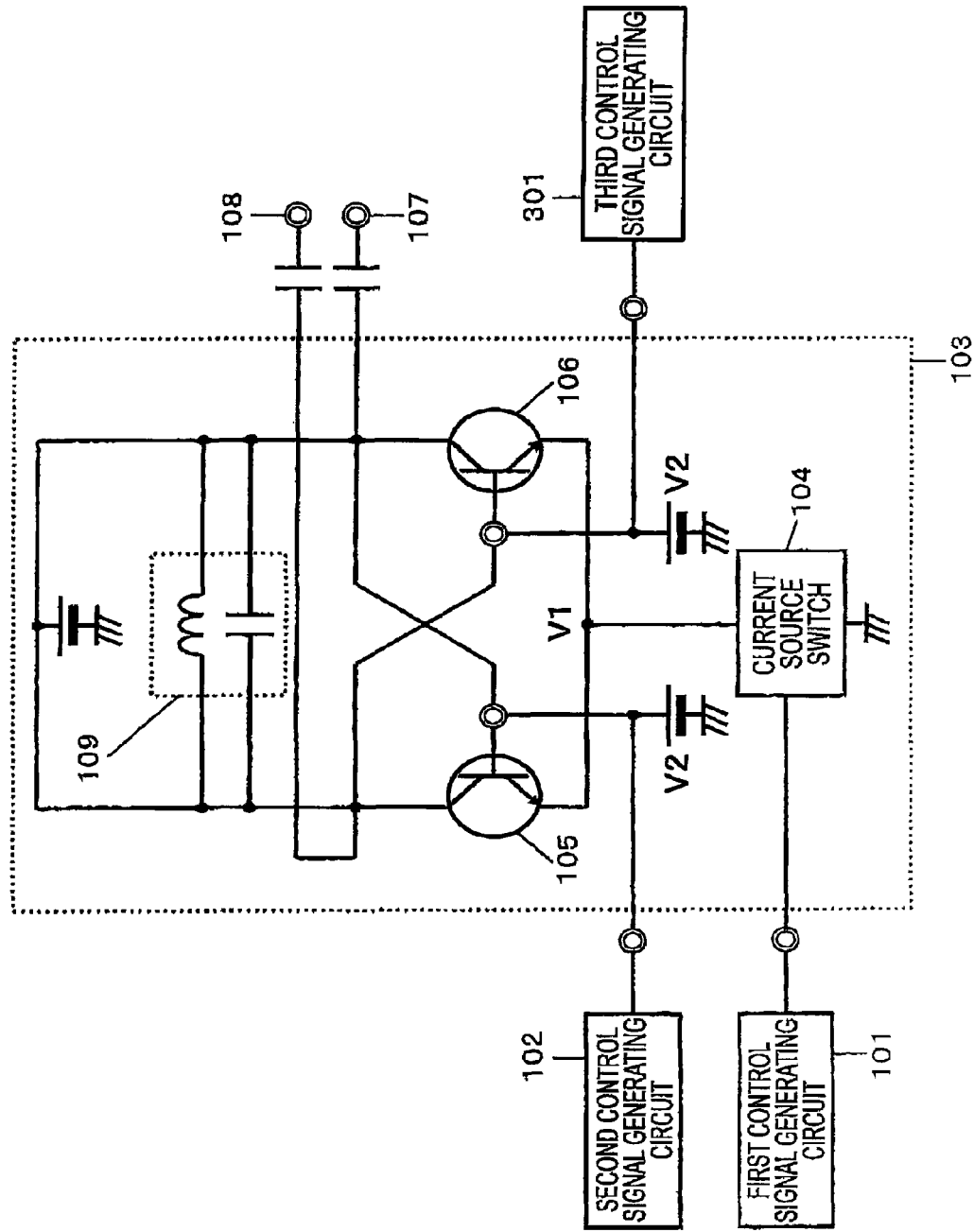
FIG. 3 A view showing another configuration of a differential oscillation apparatus in Embodiment 1 of the present invention.

Here, in FIG. 1, the output of the second control signal generation circuit 102 is connected only to the base terminal of the transistor 105. In this case, as shown in FIG. 3, a third control signal generation circuit 301 that outputs the signal 203 shown in FIG. 2 may be connected to the base terminal of the transistor 106.

In this case, a potential at the base terminal of the transistor 105 is higher than the voltage V2 by the control signal 202 output from the second control signal generation circuit 102, and then goes back to V2 thereafter. At the same time, a potential at the base terminal of the transistor 106 is decreased lower than the voltage V2 by the control signal 203 output from the third control signal generation circuit 301, and then goes back to V2 thereafter. Accordingly, potential variations at the base terminals, of the transistor 105 and the transistor 106 are decided on positive and negative sides respectively. As a result, phases in the initial stage of the oscillation can be decided mutually in the opposite phase respectively, and also the differential oscillation can be realized from the initial stage of the oscillation.

Like the explanation in FIG. 1, output signals output from the output terminal 107 and the output terminal 108 are opposite in phase from a start time of the oscillation. Even when the output signal is obtained based on the potential difference between two output terminals, the differential oscillator portion can obtain the large amplitude in such a way that voltage oscillations from two terminals are not canceled mutually in a start time of the oscillation.

As a result, a rising of the output signal is accelerated, and thus the intermittent differential oscillation apparatus can generate the output signal whose pulse width is set in unit of nanosecond. According to the configuration of the present embodiment, such an effect can be achieved separately that a precision of a timing at which the output signals whose phases are opposite occur can be improved.

In the above explanation, the differential operation delay time is shortened by inputting the rectangular control signal to the base terminal of the transistor 105. In this case, the differential operation delay time can also be shortened by inputting the rectangular control signal to a collector terminal of the transistor 105.

Figure 16:
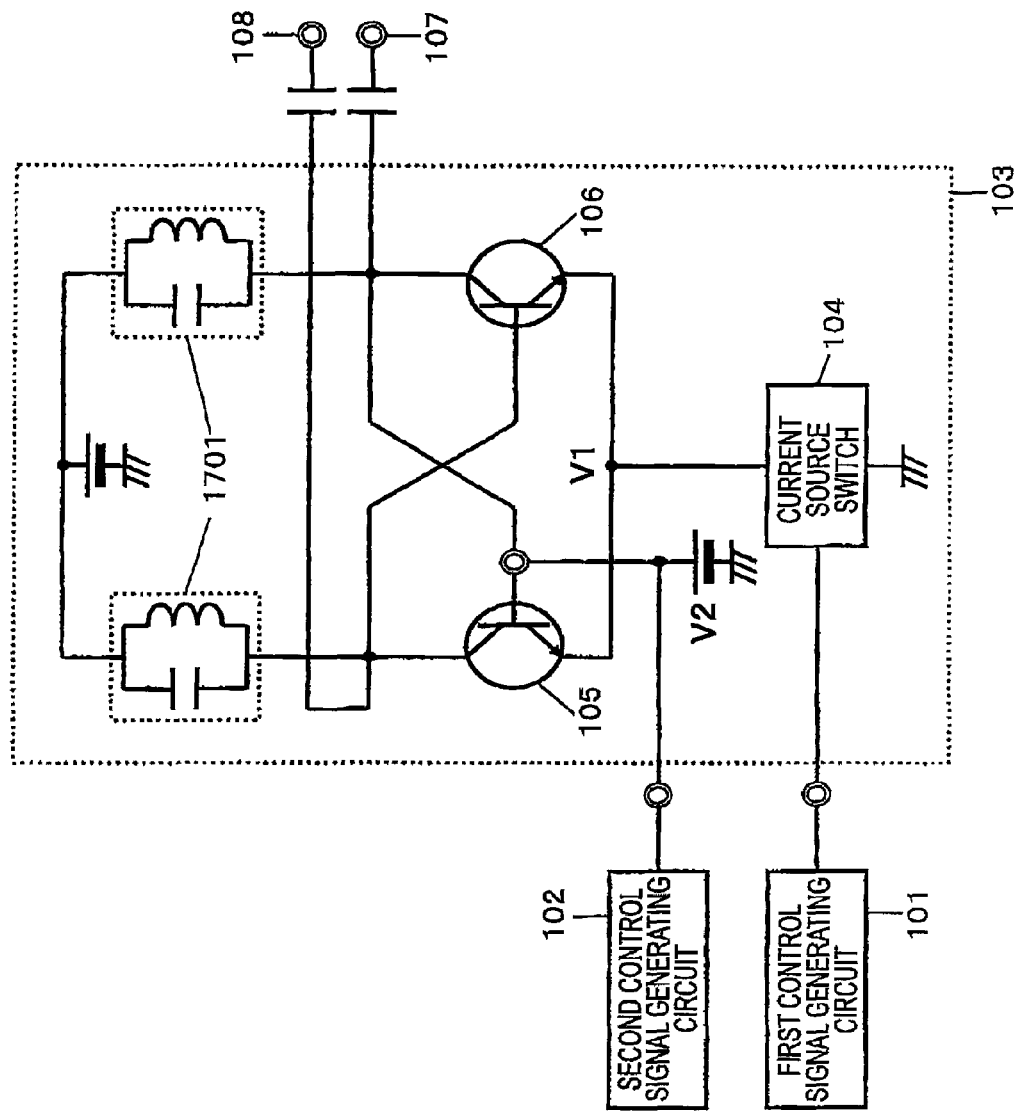
FIG. 16 A view showing another mode of the configuration of the differential oscillation apparatus in Embodiment 1 of the present invention.
Figure 17:
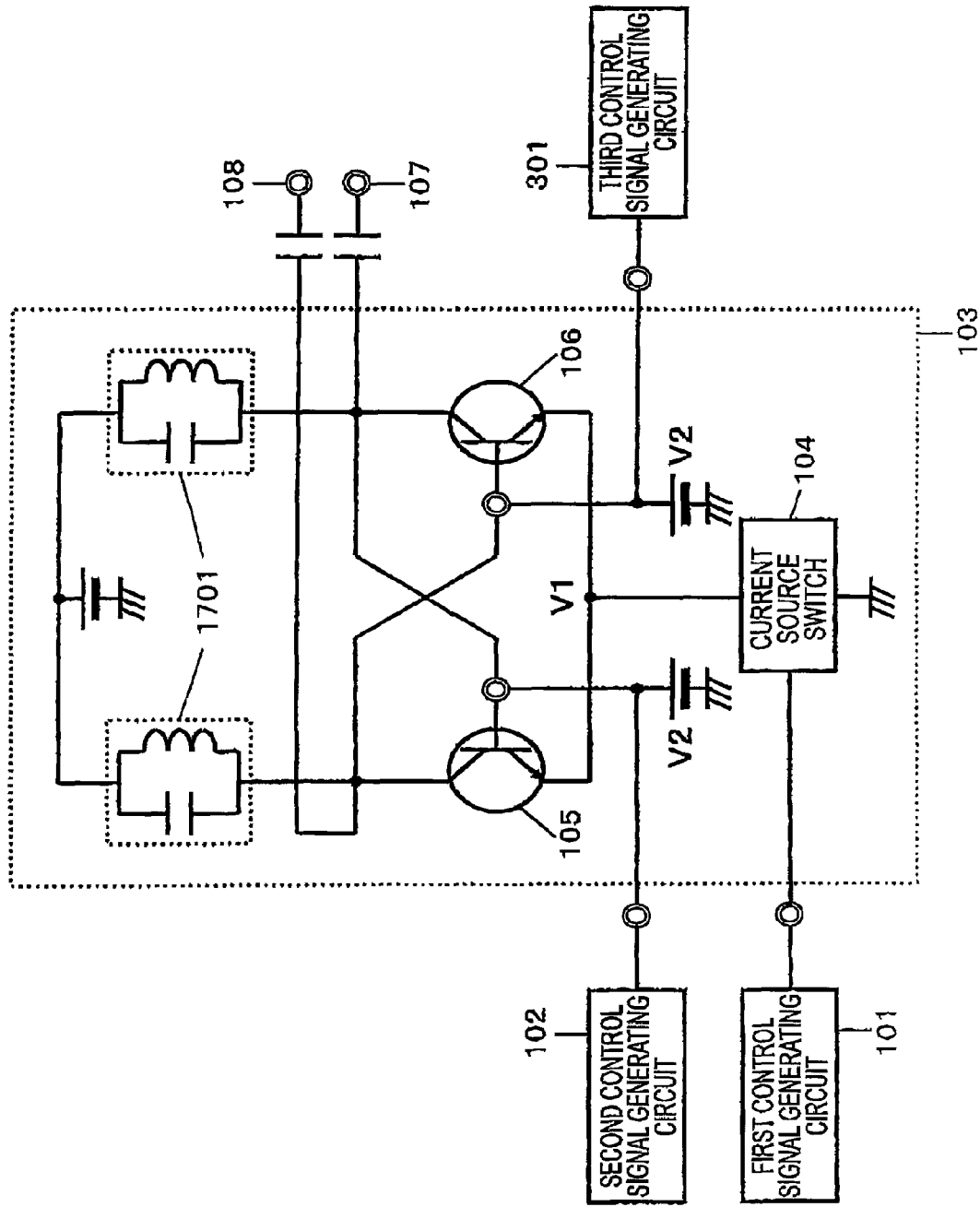
FIG. 17 A view showing still another mode of the configuration of the differential oscillation apparatus in Embodiment 1 of the present invention.

Also, as shown in FIG. 16 and FIG. 17, the configurations shown in FIG. 1 and FIG. 3 may be constructed respectively such that resonance circuits 1701 are provided by dividing the resonance circuit 109 shown in FIG. 1 and FIG. 3 into two circuits.

Also, in the above explanation, the control signal 202 is output from the second control signal generation circuit 102, and the offset voltage V2 is given when the control signal 202 is input the base terminal of the transistor 105. In this case, the same function may be contained in the second control signal generation circuit 102.

Embodiment 2

Figure 4:
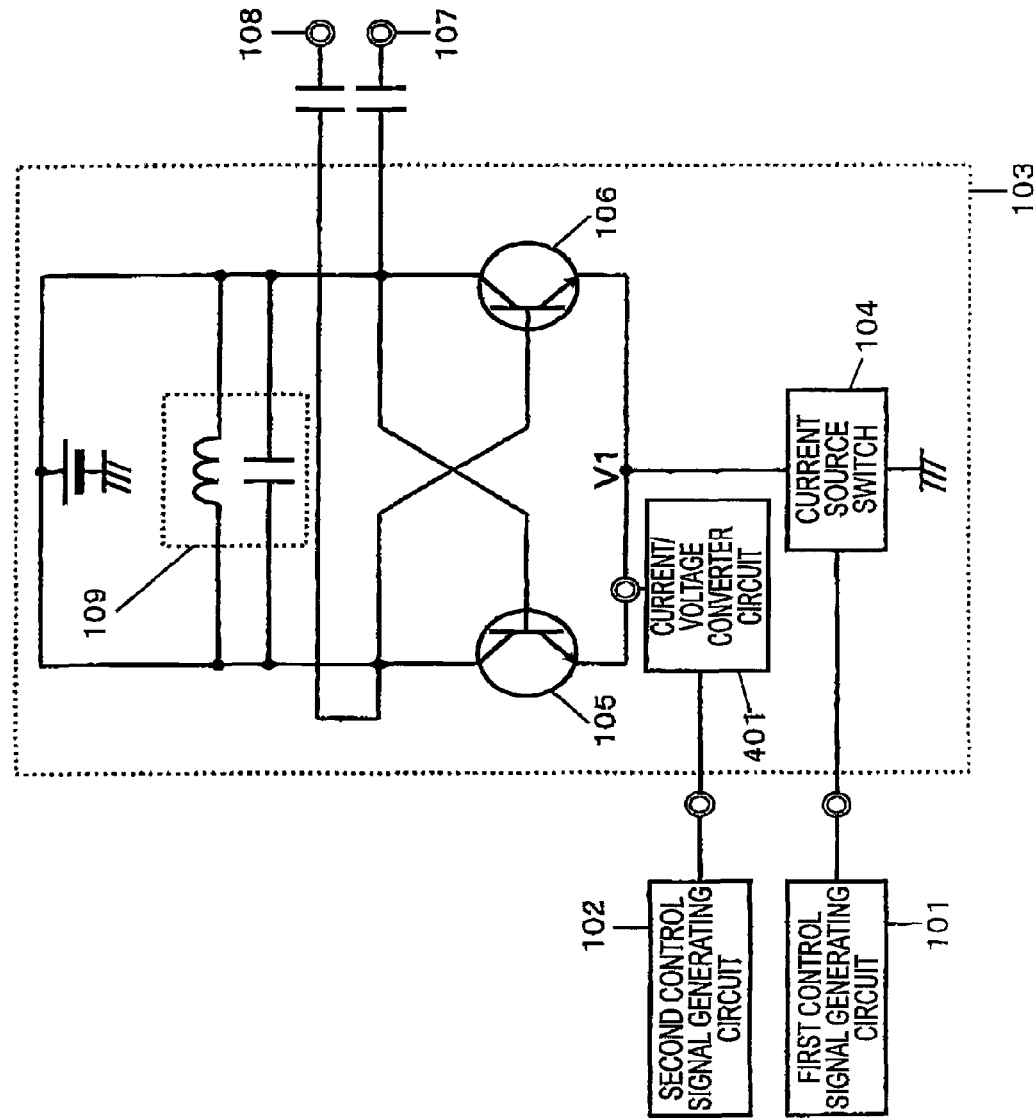
FIG. 4 A view showing a configuration of a differential oscillation apparatus in Embodiment 2 of the present invention.

A configurative view of a differential oscillation apparatus in Embodiment 2 of the present invention is shown in FIG. 4. A difference of Embodiment 2 from Embodiment 1 in FIG. 1 is that a current/voltage converter circuit 401 is provided in the subsequent stage of the second control signal generation circuit 102. A potential on the second control signal generation circuit 102 side of the current/voltage converter circuit 401 is set higher than the voltage V1. Also, the current/voltage converter circuit 401 may be constructed by a resistor, or the like, or may constructed by using a transistor as a current source.

Figure 5:
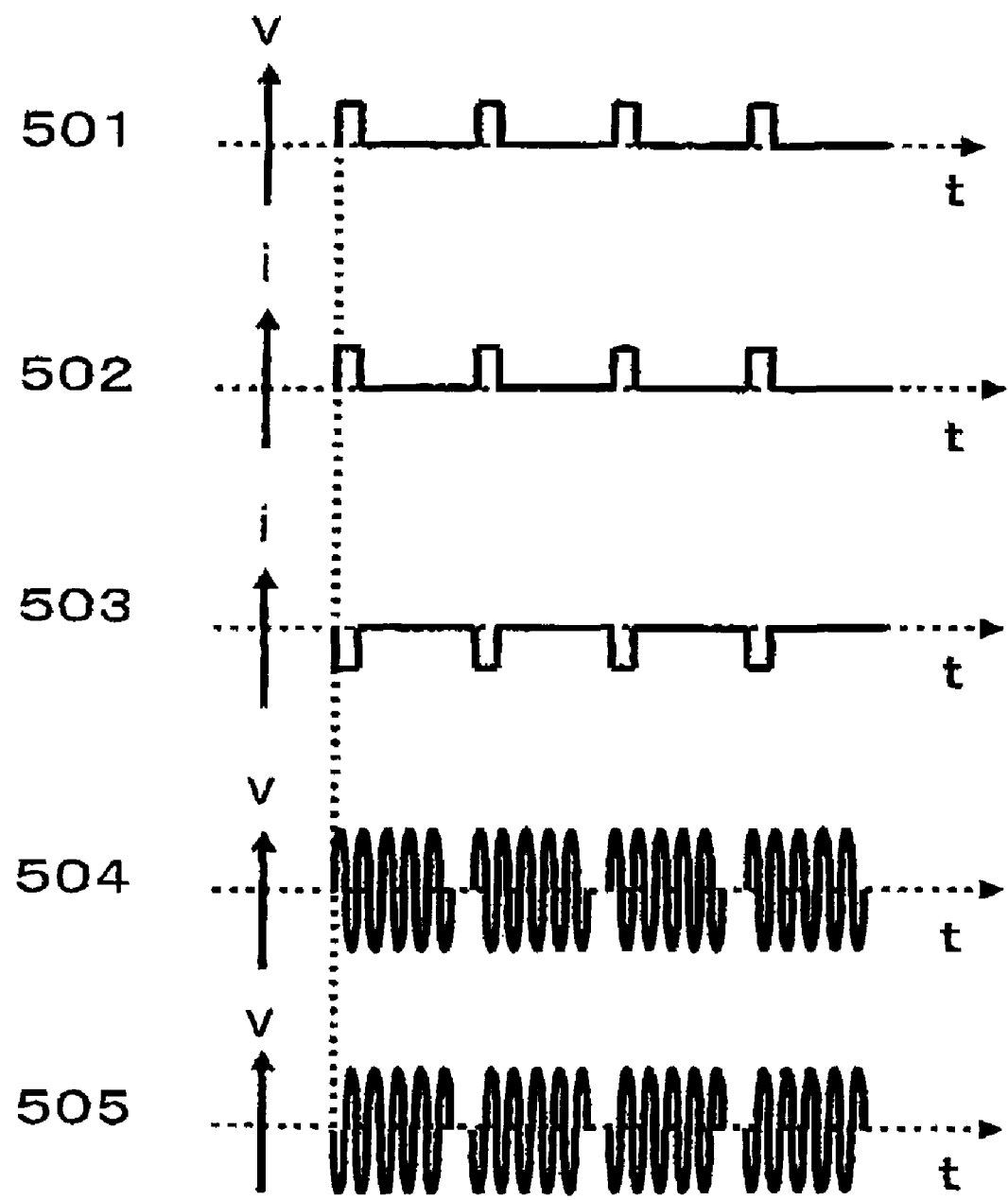
FIG. 5 A view showing control signal waveforms and output signal waveforms in Embodiment 2 of the present invention.

FIG. 5 shows a timing chart of control signals and output signals of the differential oscillation apparatus shown in FIG. 4. The differential oscillation apparatus in Embodiment 2 will be explained with reference to FIG. 4 and FIG. 5 hereunder.

A control signal 501 output from the second control signal generation circuit 102 is input into the current/voltage converter circuit 401, and is converted into a control signal 502 having a current value. The control signal 502 is input into an emitter terminal of the transistor 105, and gives a variation component of the collector current of the transistor 105.

In the differential oscillator portion 103, emitter terminals of the transistor 105 and the transistor 106 are connected to the current source switch 104. Therefore, a control signal 503 whose phase is opposite to the variation component 502 of the collector current of the transistor 105 appears as a variation component of the collector current of the transistor 106.

The phases of the differential circuit can be adjusted from a start time of the oscillation by the variation components 502, 503 of the collector currents, and the differential oscillation apparatus whose differential operation delay time is short can be constructed. Therefore, an output signal 504 and an output signal 505 that are in an opposite phase from a start time of the oscillation respectively are output from the output terminal 107 and the output terminal 108 respectively. In this manner, the intermittent differential oscillation apparatus whose differential operation delay time is short can be constructed by inputting the control signal 501 to the emitter terminal of one transistor 105 of the differential oscillator portion 103.

In the above explanation, the control signal 501 output from the second control signal generation circuit 102 is connected only to the emitter terminal of the transistor 105 via the current/voltage converter circuit 401. In this case, like the explanation by reference to FIG. 3 in Embodiment 1, the third control signal generation circuit 301 may also be connected to the emitter terminal of the transistor 106 via the current/voltage converter circuit 401. By doing this, such an effect can be achieved separately that a precision of the timing at which the output signals whose phases are opposite occur can be improved.

Also, in the above explanation, the control signal 501 output from the second control signal generation circuit 102 via the current/voltage converter circuit 401 in FIG. 4 is input into the emitted terminal of the transistor 105. But the similar effect can be achieved even when the control signal 501 is also input into the collector terminal. In this case, the control signal may be input further into the collector terminal of the transistor 106.

Also, in the above explanation, such a configuration is explained that the second control signal generation circuit 102 and the third control signal generation circuit 301 are connected to the same terminal mutually. In this case, even when the second control signal generation circuit 102 is connected to the emitter terminal of the transistor 105 and the third control signal generation circuit 301 is connected to the collector terminal of the transistor 106, the similar effect can be achieved. This is similarly true of the case where the second control signal generation circuit 102 is connected to the collector terminal of the transistor 105 and the third control signal generation circuit 301 is connected to the emitter terminal of the transistor 106.

Figure 18:
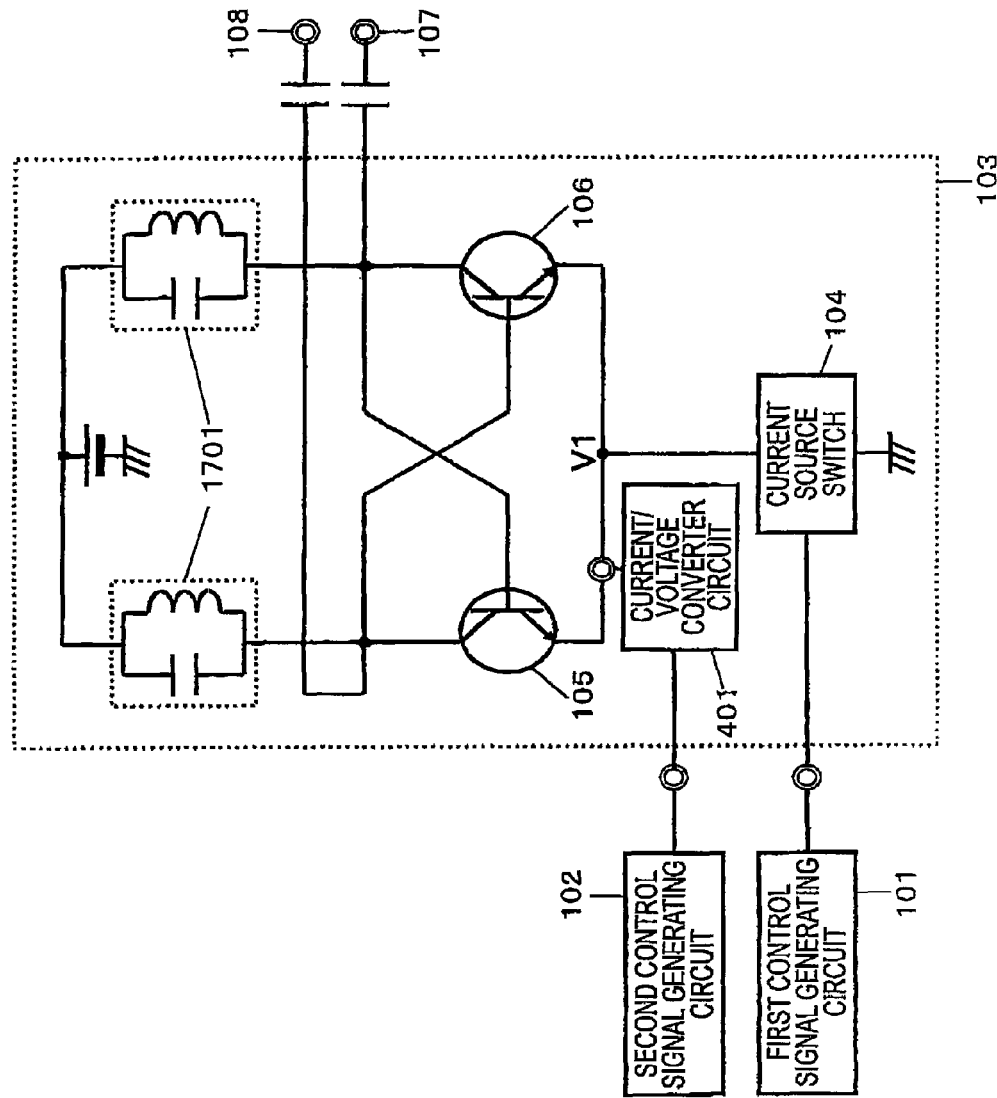
FIG. 18 A view showing another mode of the configuration of the differential oscillation apparatus in Embodiment 2 of the present invention.

Also, as shown in FIG. 18, the configuration in FIG. 4 may be constructed such that the resonance circuit 109 in FIG. 4 is divided into two resonance circuits 1701.

Embodiment 3

Figure 6:
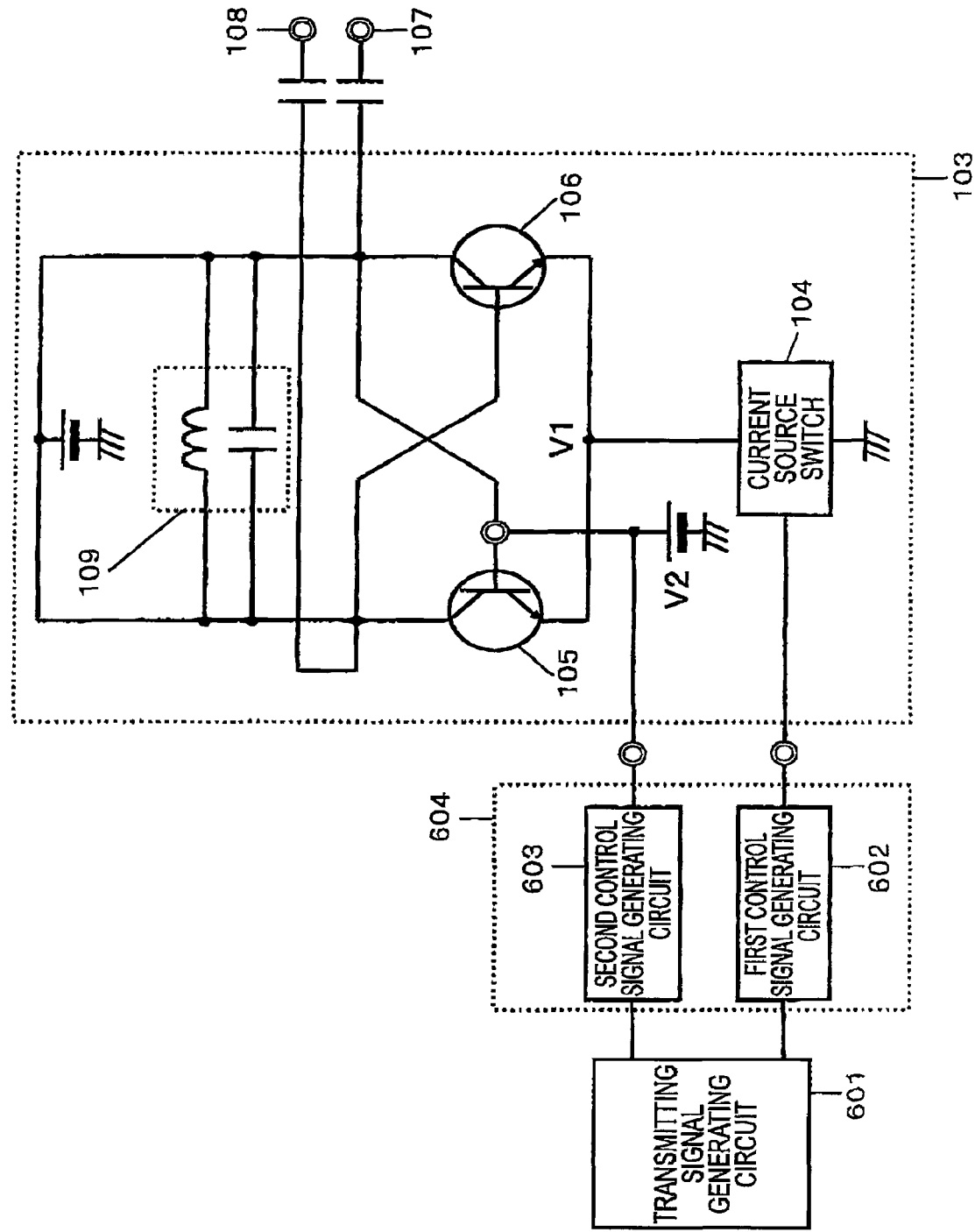
FIG. 6 A view showing a configuration of a modulator in Embodiment 3 of the present invention.
Figure 7:
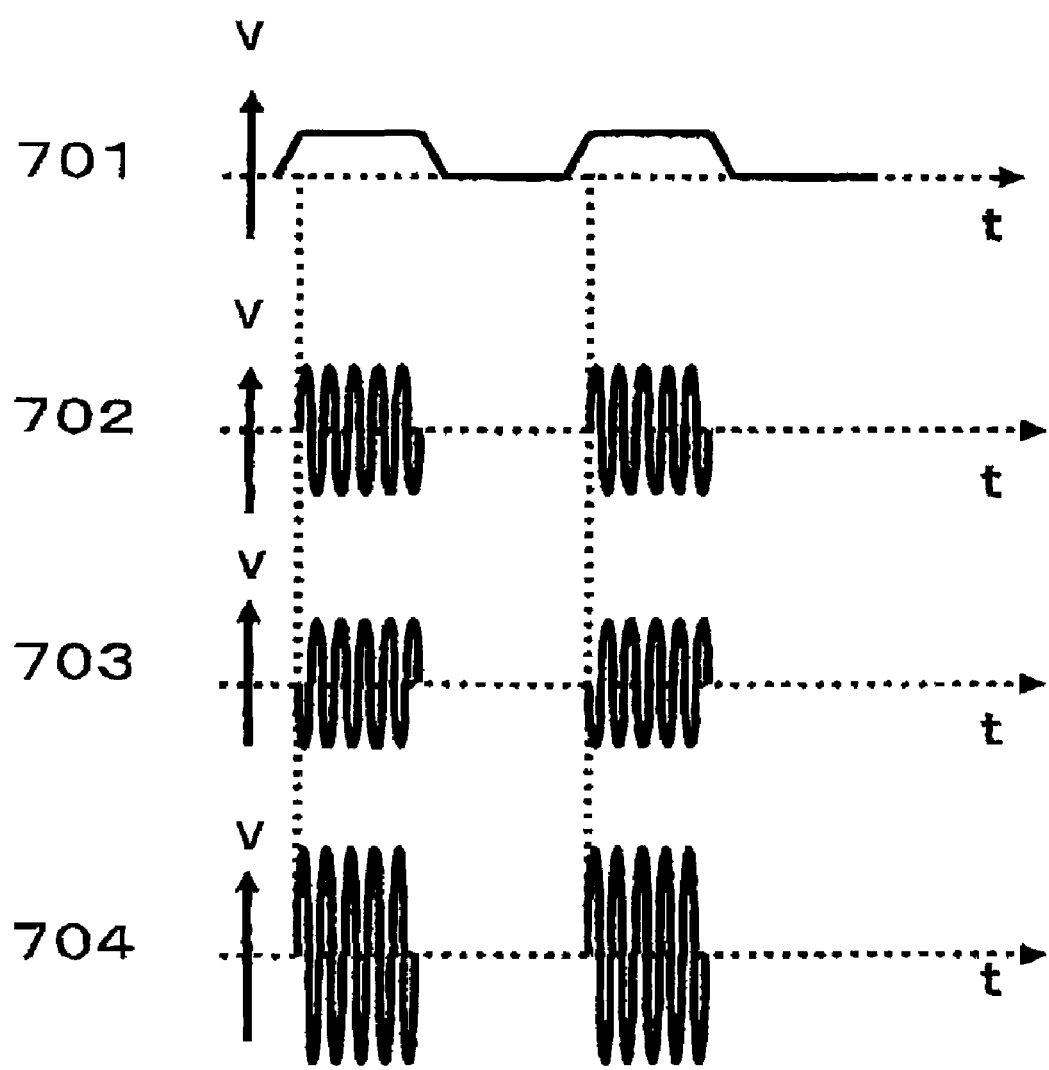
FIG. 7 A view showing a transmitting signal and output signals of the modulator in Embodiment 3 of the present invention.

FIG. 6 is a view showing a configuration of a modulator in Embodiment 3 of the present invention. The modulator can be constructed by attaching further a transmitting signal generation circuit 601 to the differential oscillation apparatus in Embodiment 1. FIG. 7 shows a timing chart of a transmitting signal, the control signal, and output signals in the modulator using the differential oscillation apparatus shown in FIG. 6. An operation of the modulator in the present embodiment will be explained by reference to FIG. 6 and FIG. 7 hereunder.

A transmitting signal 701 output from the transmitting signal generation circuit 601 is input into a control signal generating circuit group 604 that consists a first control signal generation circuit 602 and a second control signal generation circuit 603. Then, control signals whose voltage value is changed in response to a voltage value of the transmitting signal 701 respectively are output respectively. Thus, amplitude of the output signals of the differential oscillation apparatus can be controlled arbitrarily.

Here, the processes of outputting the output signal 702 and the output signal 703 by causing the differential oscillator portion 103 to oscillate intermittently are explained in Embodiment 1, and thus their explanation will be omitted herein. When a voltage value of the transmitting signal being output from the transmitting signal generation circuit 601 is high, the output signal 702 is output from the output terminal 107 and the output signal 703 is output from the output terminal 108.

Figure 8:
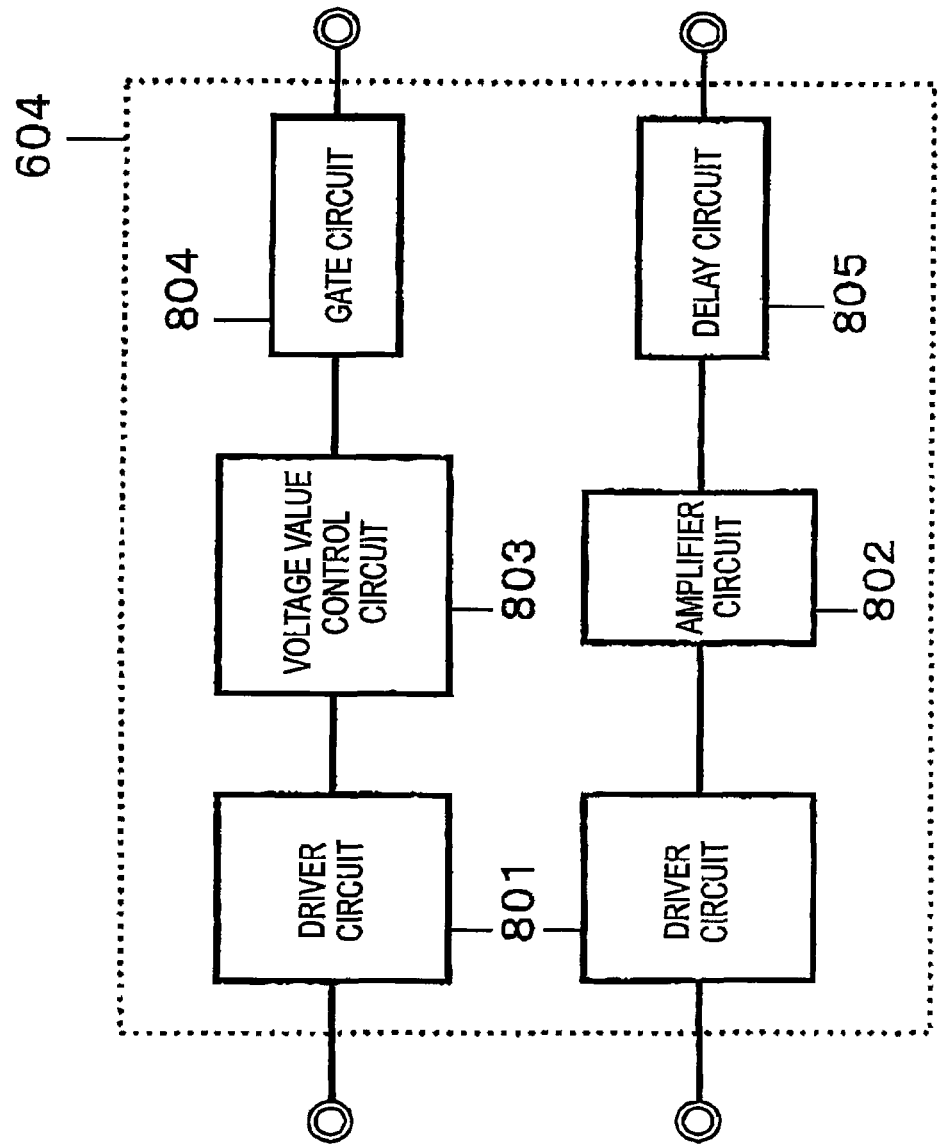
FIG. 8 A view showing a configuration of a control signal generation circuit group in Embodiment 3 of the present invention.
Figure 9:
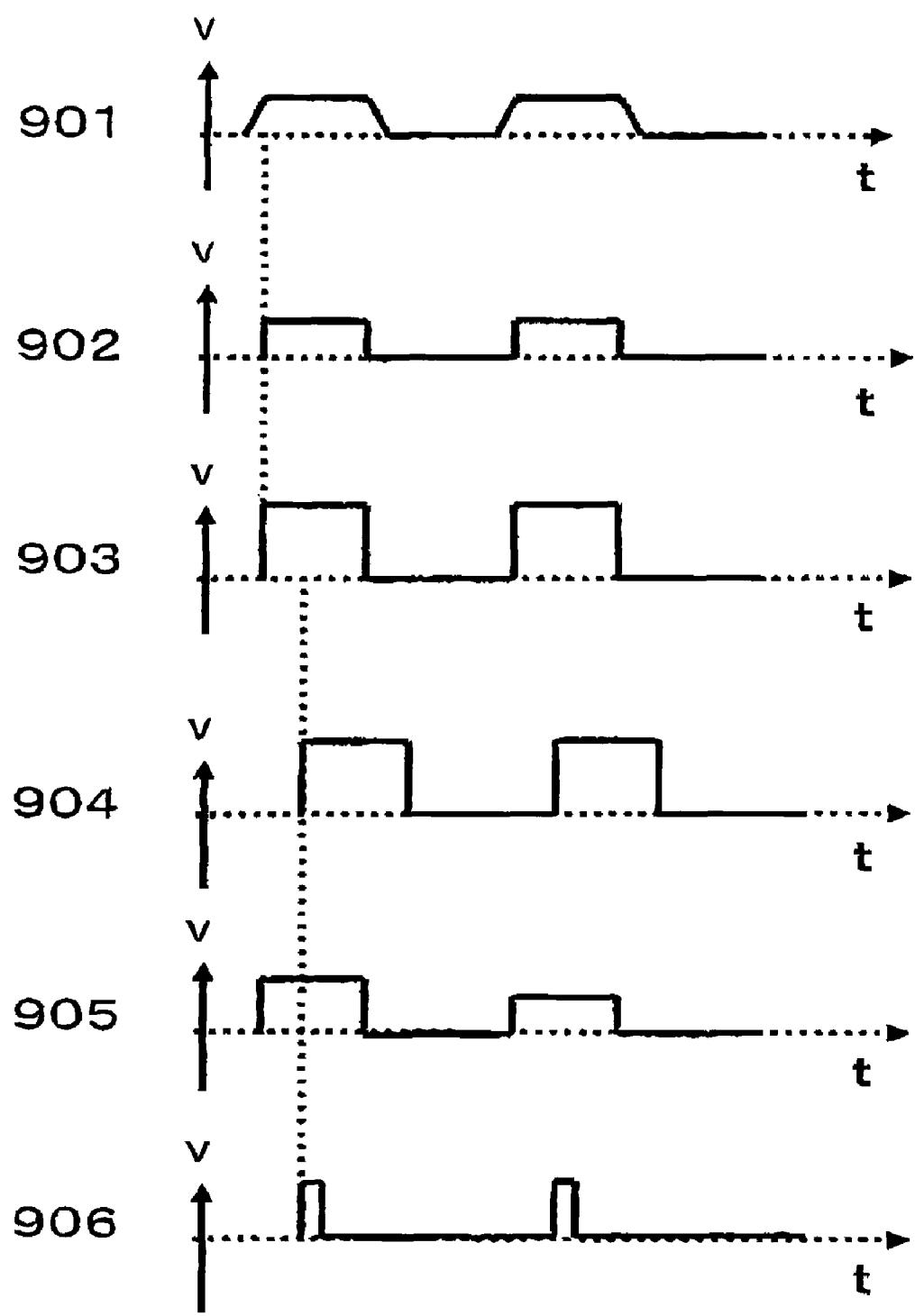
FIG. 9 A view showing control signal waveforms in Embodiment 3 of the present invention.

FIG. 8 shows a configuration of the control signal generation circuit group 604, and FIG. 9 is a timing chart of control signals generated by the control signal generation circuit group 604. An operation of an embodiment of the control signal generation circuit group 604 will be explained with reference to FIG. 8 and FIG. 9 hereunder.

A transmitting signal 901 output from the transmitting signal generation circuit 601 is input into the first control signal generation circuit 602, then is converted into a signal 902 whose leading edge is sharp by a driver circuit 801 and input into an amplifier circuit 802, and then output as a signal 903 that has a voltage value enough to drive the current source switch 104. Then, the signal 903 is input into a delay circuit 805, and a signal 904 that is delayed for any time is output.

Also, the transmitting signal 901 is similarly input into the second control signal generation circuit 603, then is converted into the signal 902 whose leading edge is sharp by the driver circuit 801, and then is input a voltage value control circuit 803.

In this case, the voltage value control circuit 803 is constructed by an amplifier circuit or a limiter circuit. It can be decided depending on a magnitude relationship between a voltage value of the transmitting signal 901 and a desired voltage value of the signal being input into the terminal of one transistor 105 of the differential oscillator portion 103 which circuit should be suitable for this voltage value control circuit 803. In FIG. 9, a control signal 905 whose amplitude is adjusted is shown as the case where the voltage value control circuit 803 is constructed by the amplifier circuit in FIG. 8.

Then, the control signal 905 output from the voltage value control circuit 803 is input into a gate circuit 804. Thus, a pulse width of the control signal 905 is adjusted, and a signal 906 is output.

Here, the modulator of the present embodiment employs the differential oscillation apparatus whose differential operation delay time is short. Therefore, the output signals being output from the output terminal 107 and the output terminal 108 are opposite in phase from a start time of the oscillation respectively. When the output signal 704 is derived by sensing a potential difference between two output terminals, the large amplitude can be obtained even in the start time of the oscillation such that the voltage vibrations of the output signals from two output terminals are not canceled.

As a result, the rising of the output signal of the intermittent differential oscillation apparatus can be accelerated, and the output signal whose pulse width is set in unit of nanosecond can be generated. Thus, a rapid modulator whose output signal 704 is output in response to a voltage value of the control signal 701 can be realized.

In the above explanation, the control signal of the second control signal generation circuit 102 is input into the base terminal of the transistor 105 in FIG. 6. In this case, when the control signal is input into the collector terminal as shown in Embodiment 1, the similar effect can be achieved.

Figure 19:
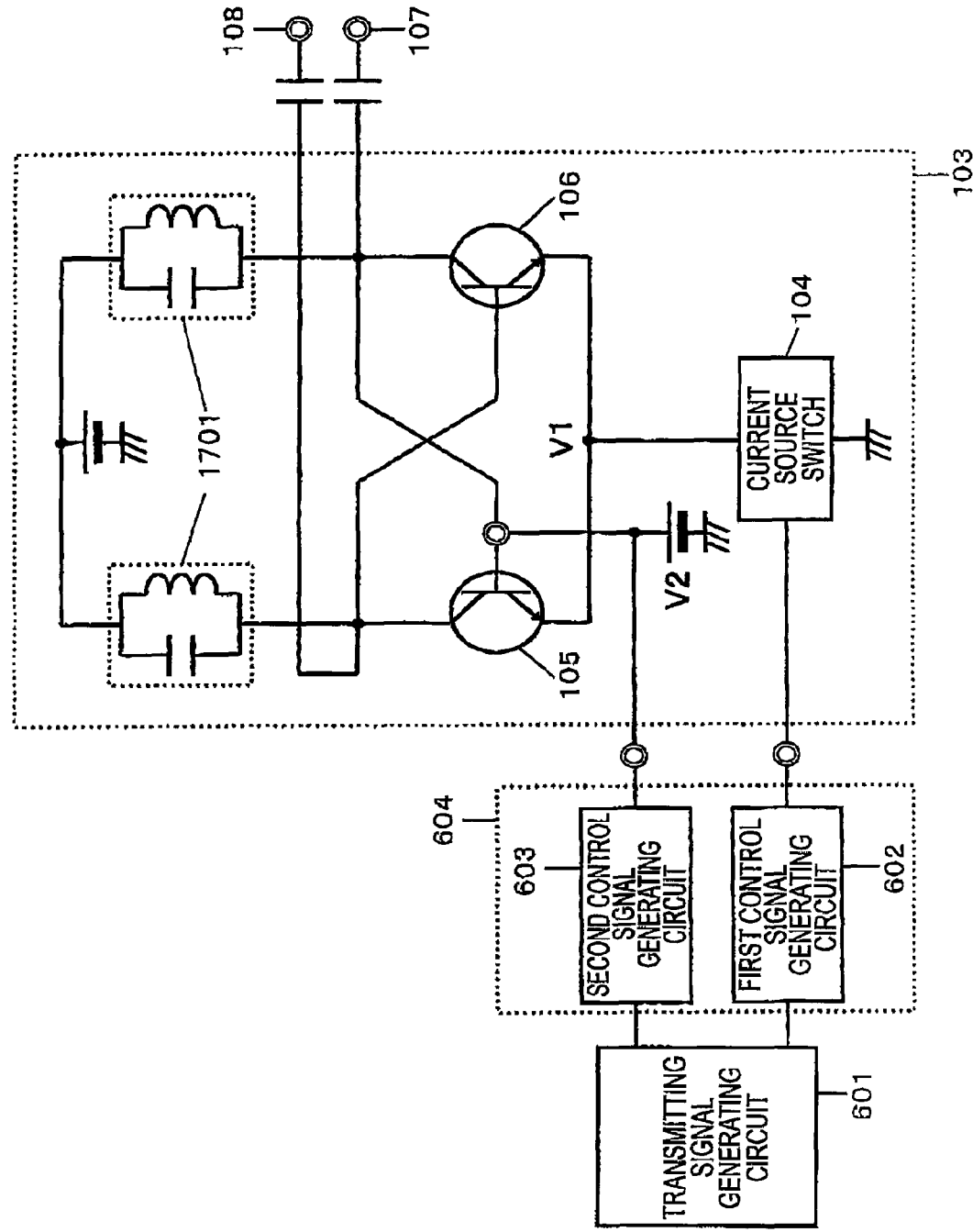
FIG. 19 A view showing another mode of the configuration of the differential oscillation apparatus in Embodiment 3 of the present invention.

Also, in the above explanation, the modulator circuit is constructed by adding the transmitting signal generating circuit to the intermittent differential oscillation apparatus shown in FIG. 3. But the similar effect can be obtained by adding similarly the transmitting signal generating circuit to the intermittent differential oscillation apparatus shown in FIG. 4. Here, as shown in FIG. 19, the configuration in FIG. 6 may be constructed such that the resonance circuit 109 in FIG. 6 is divided into two resonance circuits 1701.

Embodiment 4

Figure 10:
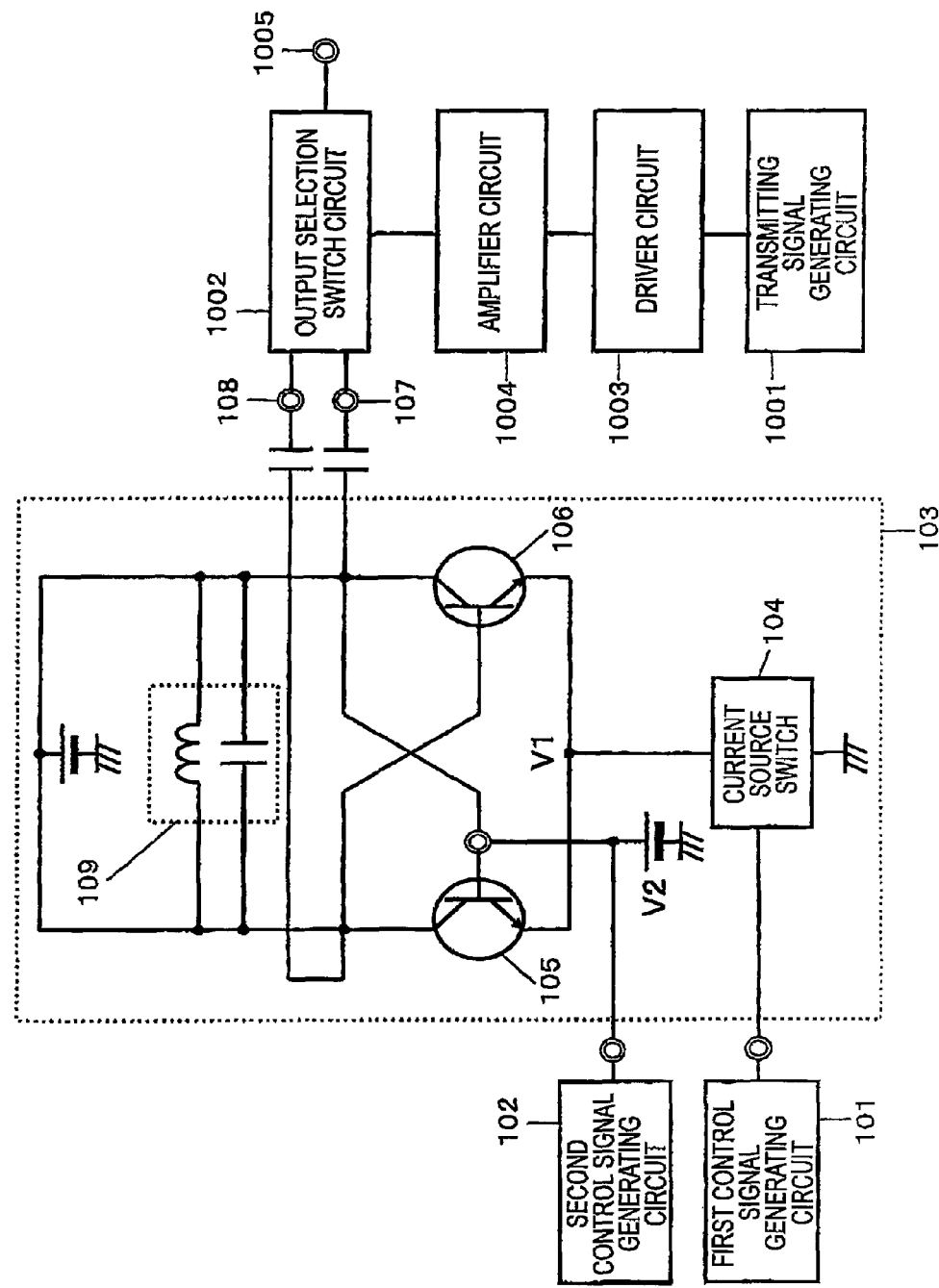
FIG. 10 A view showing a configuration of a modulator in Embodiment 4 of the present invention.
Figure 11:
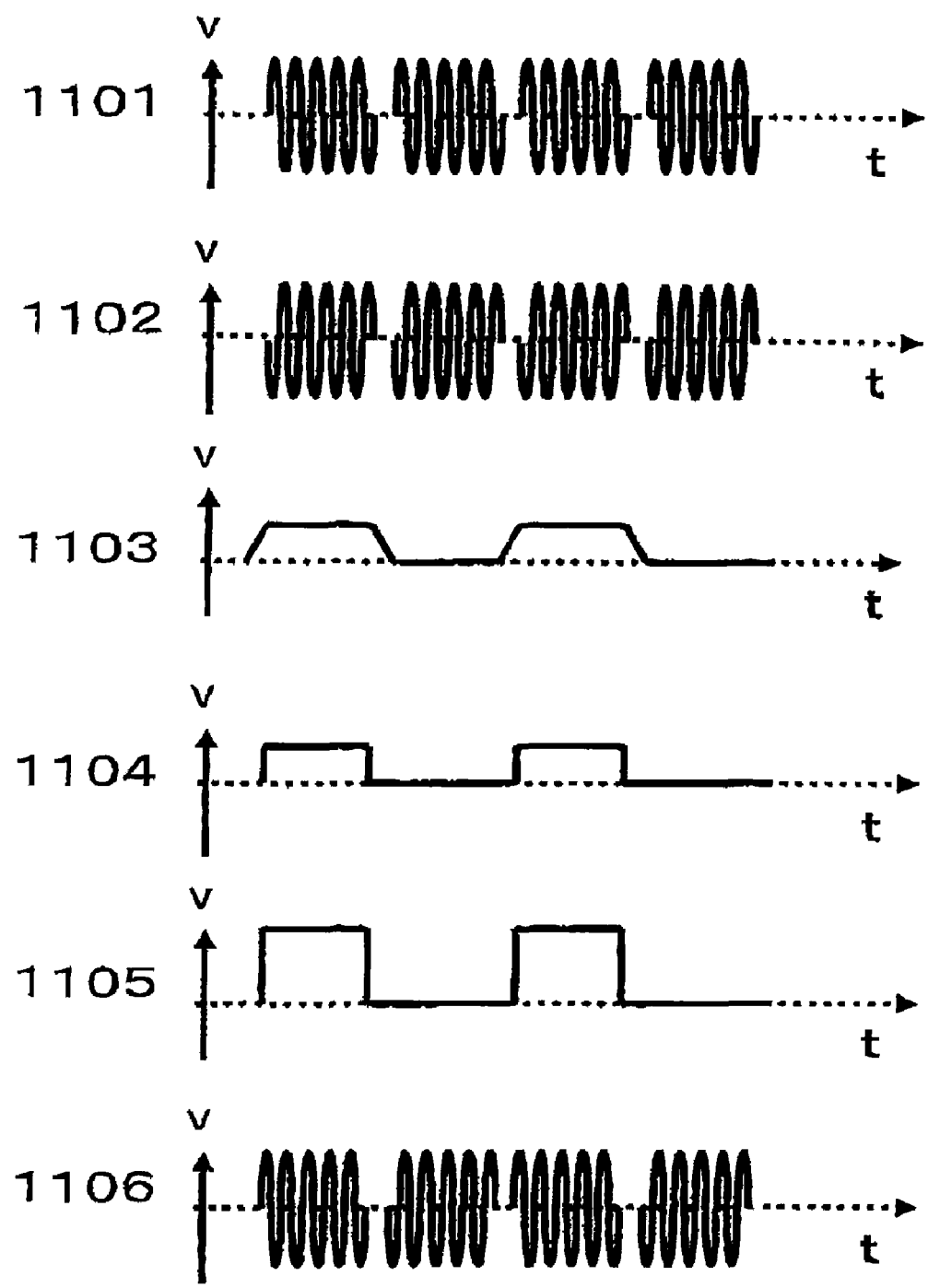
FIG. 11 A view showing control signal waveforms and output signal waveforms in Embodiment 4 of the present invention.

A configuration of a modulator in Embodiment 4 of the present invention is shown in FIG. 10. The present embodiment shows a modulator in which an output selecting switch circuit is added to the output portion of the differential oscillation apparatus. A block diagram of the modulator is shown in FIG. 10, and a change of waveforms in FIG. 10 is shown in FIG. 11.

As shown in FIG. 10, a transmitting signal generation circuit 1001 for outputting a transmitting signal 1103, an output selection switch circuit 1002, a driver circuit 1003, and an amplifier circuit 1004 are provided. Therefore, phases of output signals 1101, 1102 of the differential oscillator portion 103 can be controlled arbitrarily in response to a voltage value of the transmitting signal 1103. The processes of generating the output signals 1101, 1102 that are output from the output terminal 107 and the output terminal 108 respectively are explained in Embodiment 1, and therefore their explanation will be omitted herein.

First, the output signal 1101 and the output signal 1102 are input into the output selection switch circuit 1002. A switching operation of the output selection switch circuit 1002 is controlled by a voltage value of the transmitting signal 1103 output from the transmitting signal generation circuit 1001.

Then, the driver circuit 1003 converts the transmitting signal 1103 into a signal 1104 whose leading edge is sharp. The signal 1104 is input into the amplifier circuit 1004, then is converted into a signal 1105 that has a voltage value enough to drive the output selection switch circuit 1002, and then is input into the output selection switch circuit 1002.

For example, the output selection switch circuit 1002 can execute the switching operation such that the output signal 1101 is output from an output terminal 1005 when the voltage value is at a high level and the output signal 1102 is output from the output terminal 1005 when the voltage value is at a low level, and can output an output signal 1106 whose phase is changed from the output terminal 1005 in response to the transmitting signal 1103.

In this case, the modulator of the present embodiment employs the intermittent differential oscillation apparatus whose differential operation delay time is short. Therefore, the signals output from two output terminal are opposite in phase respectively from a start time of the oscillation. As a result, a phase modulation can be applied even to the intermittent oscillation output whose pulse width is set in unit of nanosecond, and thus a high-speed modulation can be carried out.

Figure 12:
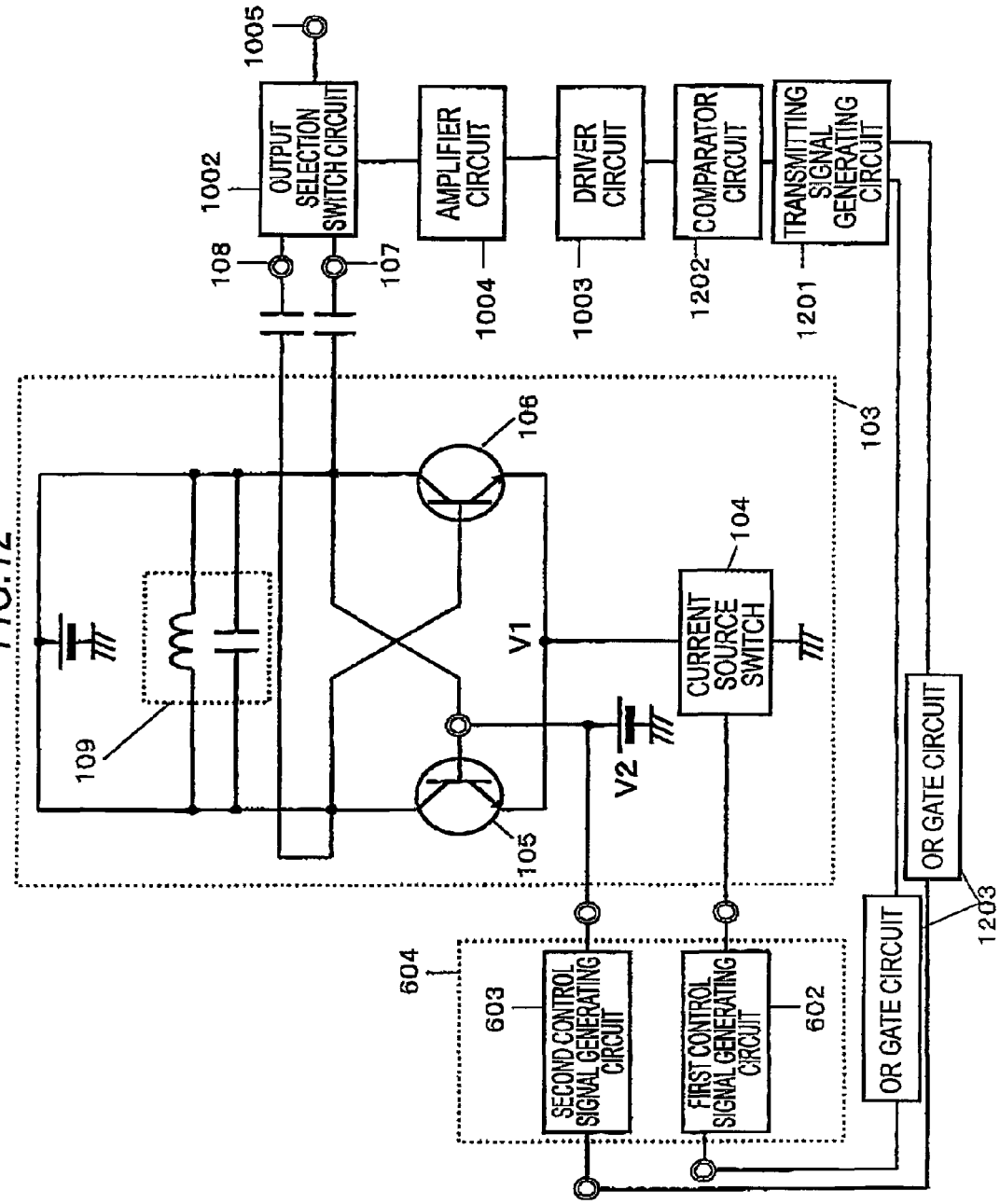
FIG. 12 A view showing another configuration of a modulator in Embodiment 4 of the present invention.

Also, as shown in FIG. 12, a modulator responding to a multiple-valued logic can be constructed by adding a comparator circuit 1202 and OR gate circuits 1203. This configuration will be explained hereunder.

Figure 13:
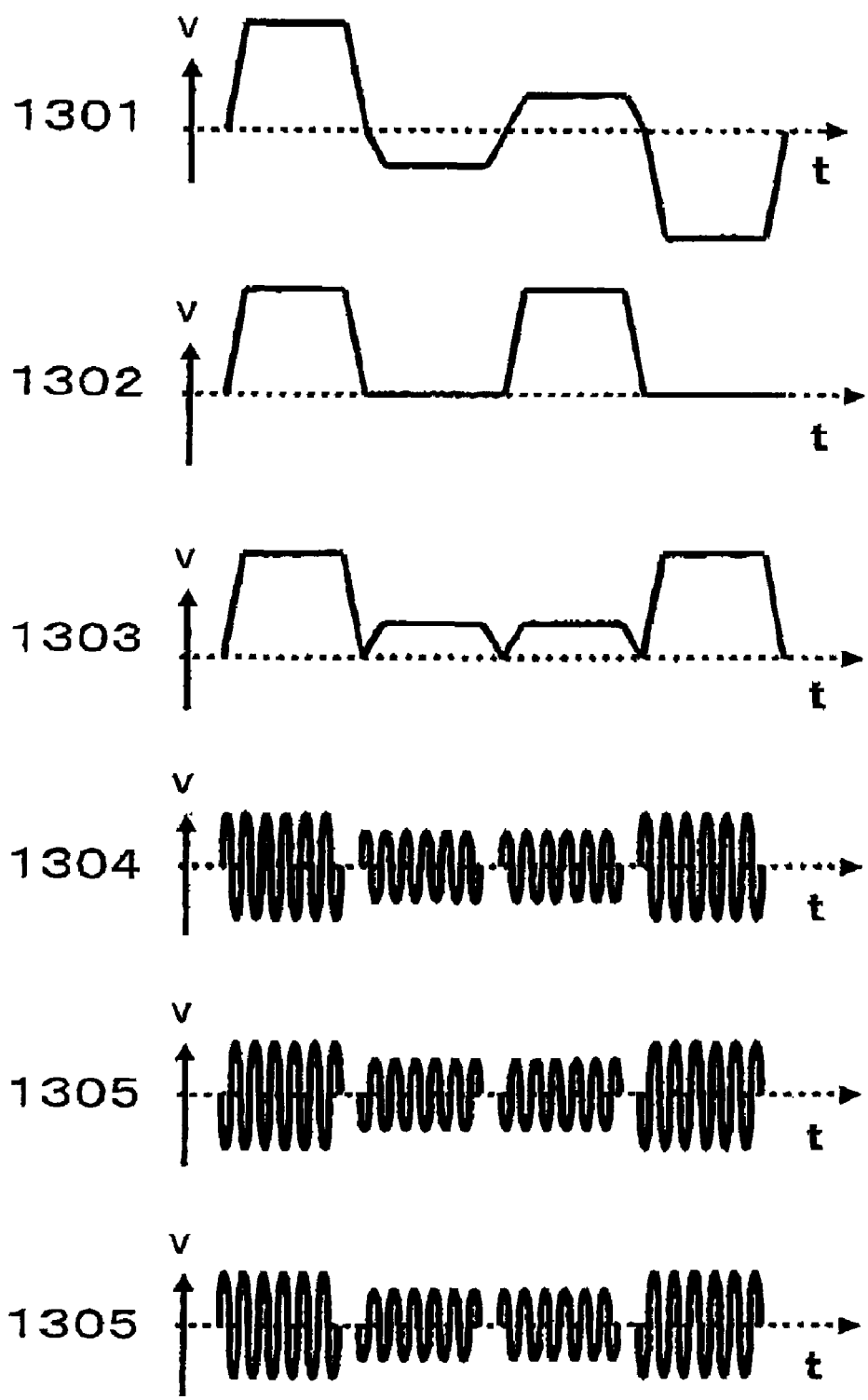
FIG. 13 A view showing control signal waveforms and output signal waveforms in Embodiment 4 of the present invention.
Figure 14:
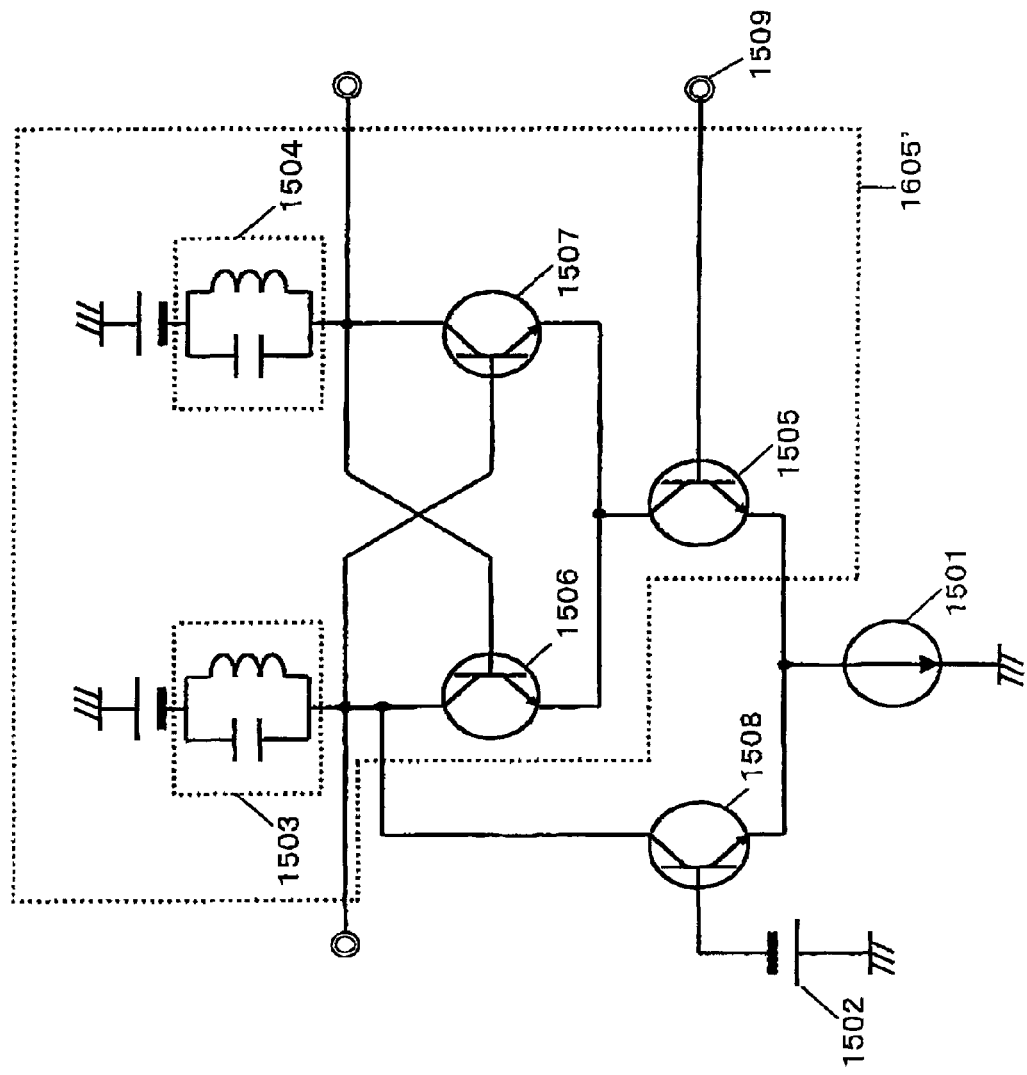
FIG. 14 A block circuit diagram showing a configuration of a differential oscillation apparatus in the prior art.
Figure 15:
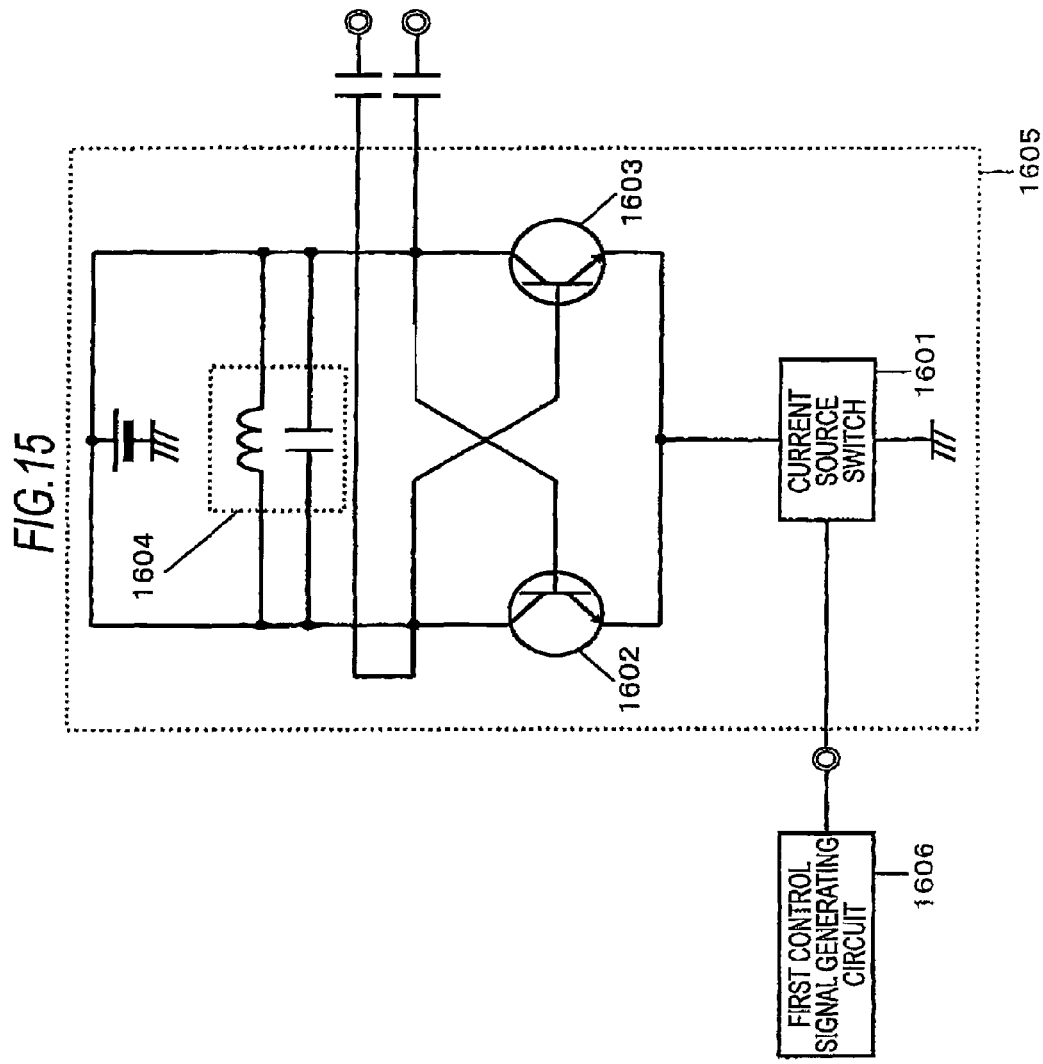
FIG. 15 A block circuit diagram showing another configuration of the differential oscillation apparatus in the prior art.

FIG. 13 is a timing chart control signal waveforms and output signal waveforms in FIG. 12. A control signal 1301 is output from a transmitting signal generation circuit 1201, and is input into the comparator circuit 1202. The comparator circuit 1202 decides 1 when a voltage value of the control signal 1301 is more than 0, and decides 0 when the voltage value is less than 0.

The control signal 1301 output from the transmitting signal generation circuit 1201 is input into the comparator circuit 1202, and output as a control signal 1302. The operations executed after the control signal 1302 is input into the driver circuit 1003 are described above, and thus their explanation will be omitted herein.

In contrast, the control signal 1301 is input from the transmitting signal generation circuit 1201 to the OR gate circuit 1203, and a control signal 1303 is given. The signal input into one input terminal of the OR gate circuit 1203 has a truth value of 1 in all symbols, and therefore the control signal 1301 is converted into the control signal 1303 by the OR gate circuit 1203.

The control signal 1303 is input into the first control signal generation circuit 602 and the second control signal generation circuit 603. The operations executed until output signals 1304, 1305 are output from the output terminal 107 and the output terminal 108 respectively after the control signal 1303 is input into the first control signal generation circuit 602 and the second control signal generation circuit 603 are described above, and thus their explanation will be omitted herein.

Any one of the output signals 1304, 1305 is output according to the voltage value of the control signal 1302 in the switch circuit. Therefore, an amplitude and a phase of an output signal 1306 output from the output terminal 1005 are changed in response to the voltage value of the control signal 1301. As a result, the modulator responding to the multiple-valued logic can be realized.

Figure 20:
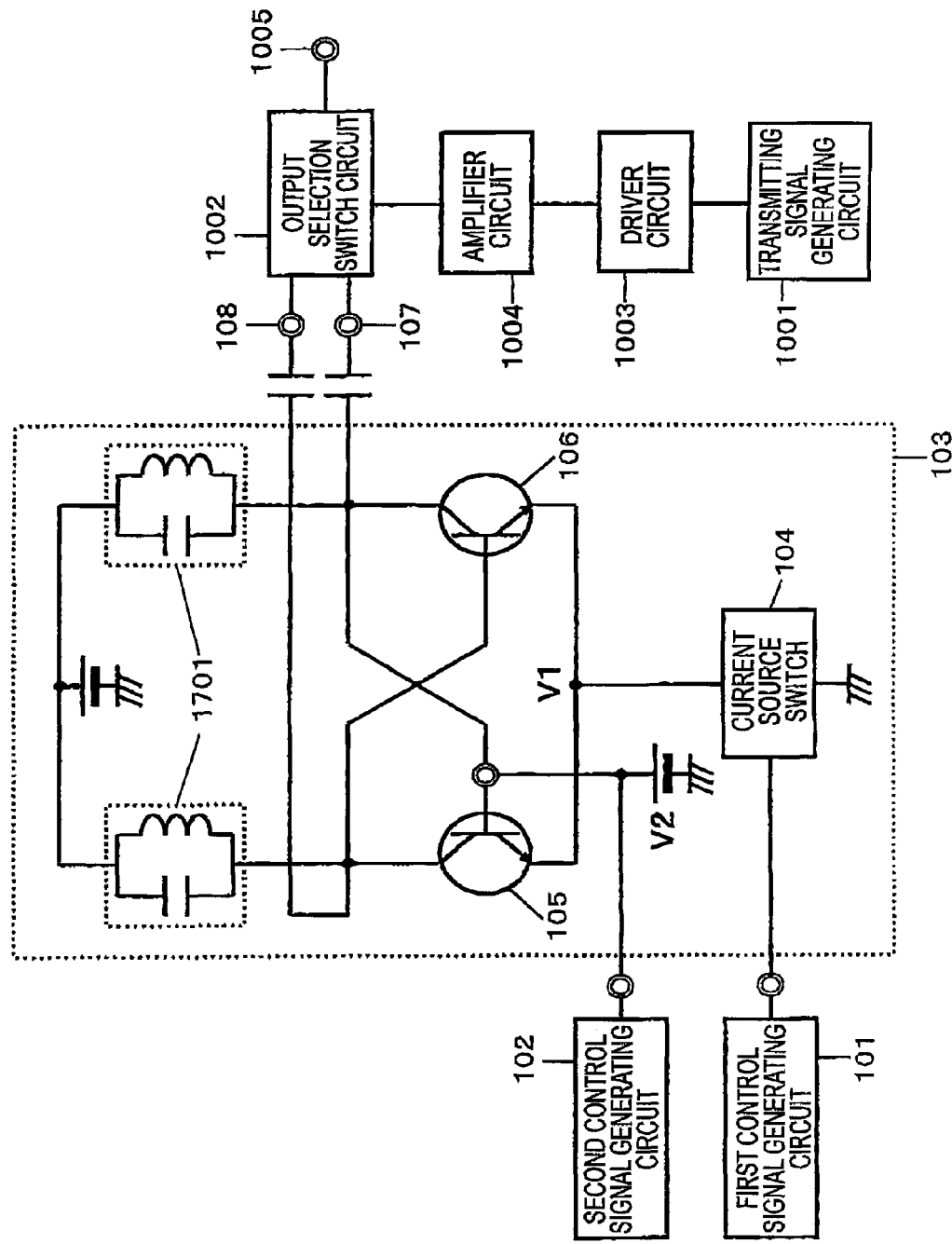
FIG. 20 A view showing another mode of the configuration of the differential oscillation apparatus in Embodiment 4 of the present invention.
Figure 21:
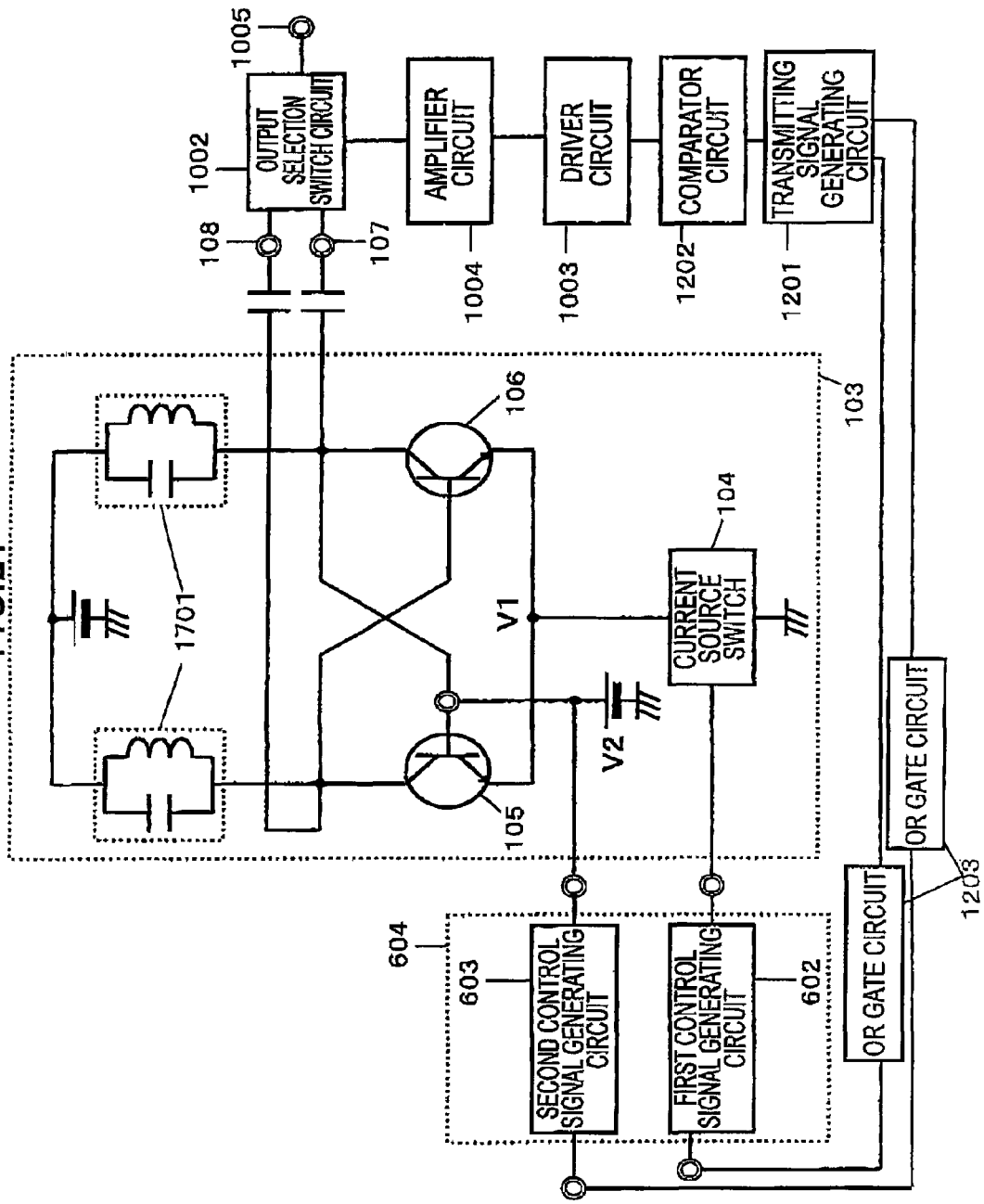
FIG. 21 A view showing still another mode of the configuration of the differential oscillation apparatus in Embodiment 4 of the present invention.

Also, a switching operation of the output selection switch circuit 1002 connected to the output terminals of the differential oscillator portion 103 is switched in response to the voltage value of the control signal 1301, and the control signal 1301 is modulated in phase. As a result, such an effect can be achieved separately that the amplitude and the phase of the output signal can be controlled by a transmitting signal 1301 and the modulation can be executed by a multiple-valued logic. As shown in FIG. 20 and FIG. 21, the configuration shown in FIG. 10 and FIG. 12 may be constructed such that the resonance circuit 109 in FIG. 10 and FIG. 12 is divided into two resonance circuits 1701.

In this case, in the above explanation from Embodiment 1 to Embodiment 4, a pulse width of the rectangular wave of the control signal is set arbitrarily. But it is desirable that the rectangular wave whose pulse width is half of a period of the oscillation frequency should be employed. By setting a pulse width in this manner, a change of the amplitude value of the collector currents of the transistor 105 and the transistor 106 can be adjusted to meet the oscillating frequency from a start time of the oscillation. As a result, the differential oscillation apparatus that can oscillate at a desired frequency from a start time of the oscillation can be constructed, and this differential oscillation apparatus can be employed in the modulator.

Also, in the above embodiments, explanation is made while employing the rectangular wave as the control signals. But any control signal such as a sinusoidal wave, a cosine wave, or the like, which has a rising time, may be employed. At this time, it is desirable that a period of the control signal such as a sinusoidal wave, a cosine wave, or the like, which has a rising time, should be set equal to a period of the oscillating frequency.

In this manner, when the period is set equal to the period of the oscillating frequency, the change of the amplitude value of the collector currents of the transistor 105 and the transistor 106 can be adjusted to meet the oscillating frequency from a start time of the oscillation. As a result, the differential oscillation apparatus that can oscillate at a desired frequency from a start time of the oscillation can be constructed, and this differential oscillation apparatus can be employed in the modulator.

Here, in the above explanation, the transistors are explained as the NPN transistor. But the PNP transistor may be employed. At that time, the power supply may be replaced with the GND, and also the GND may be replaced with the power supply.

Also, in the above explanation, the transistors are employed as active elements in the differential oscillator portion 103. But FETs (Field Effect Transistors) may be employed. At that time, the base, the collector, and the emitter may be replaced with a gate, a drain, and a source respectively. Also, a potential of the voltage V2 in FIG. 1 is either higher or lower than the voltage V1, and a difference between both voltages corresponds to a threshold voltage in the FET characteristic.

Also, in the above explanation, the case where the differential oscillation apparatus is operated intermittently is explained. In this case, when the present invention is employed, the rising of the output signal of the differential oscillation apparatus can also be accelerated in starting the differential oscillation apparatus.

With the above, the present invention is explained by using the drawings. But the present invention can be implemented as a semiconductor integrated circuit or a system, which can do similar operations.

The present invention is explained in detail with reference to the particular embodiment as above. But it is apparent for those skilled in the art that various variations and modifications can be applied without departing from a spirit and a scope of the present invention.

This application is based upon Japanese Patent Application (Patent Application No. 2006-159455) filed on Jun. 8, 2006 and Japanese Patent Application (Patent Application No. 2007-124720) filed on May 9, 2007; the contents of which are incorporated herein by reference.

INDUSTRIAL APPLICABILITY

In the differential oscillation apparatus of the present invention, besides the control signal used to control the intermittent operation, the control signal is input into the terminal of one transistor constituting the differential oscillation apparatus, and thus the output signals output from two output terminals can be set in the opposite phase from a start time of the oscillation respectively. Therefore, even when the pulse width of the output signal is set in unit of nanosecond, the output signal whose rising is rapid can be obtained from the potential difference between two terminals. As a result, the present invention can be employed as the differential oscillation apparatus, the modulator, or the like in the high-speed radio communication. Also, the present invention can be used as the modulator, or the like that can respond to the multiple-valued logic.

The invention claimed is:
1. A differential oscillation apparatus, comprising:
a differential oscillator portion which includes a first transistor and a second transistor, one terminals of which are connected in common and other two terminals of which are connected to cross each other and the one terminals of which connected in common are connected to a current source;

two output terminals; and
an external input terminal which is provided to a terminal of either of the first transistor and the second transistor,
wherein a first control signal for controlling a start and an end of an operation of the current source is supplied to a terminal of the current source;
wherein a second control signal for controlling a voltage between terminals of the first transistor and the second transistor is supplied to the external input terminal; and
wherein the second control signal is a rectangular wave whose pulse width is half of an oscillating period.

2. The differential oscillation apparatus according to claim 1, wherein emitters of the first transistor and the second transistor are connected in common and bases and collectors of which are connected to cross each other; and
wherein the external input terminal is provided to a base or a collector of the first transistor or the second transistor.

3. The differential oscillation apparatus according to claim 1, further comprising:
a first control signal generator portion which generates the first control signal and outputs the first control signal to a terminal of the current source; and
a second control signal generator portion which generates the second control signal and outputs the second control signal to the external input terminal.

4. The differential oscillation apparatus according to claim 2, wherein the external input terminal is provided to a base of the first transistor or the second transistor; and
wherein the second control signal controls a base voltage of the first transistor or the second transistor.

5. The differential oscillation apparatus according to claim 1, wherein the second control signal that exists in a rising period of the first control signal.

6. A differential oscillation apparatus comprising:
a differential oscillator portion which includes a first transistor and a second transistor, one terminals of which are connected in common and other two terminals of which are connected to cross each other and terminals of which connected in common are connected to a current source;
two output terminals;
a first external input terminal which is provided to any one of terminals of the first transistor; and
a second external input terminal which is provided to any one of terminals of the second transistor,
wherein a first control signal for controlling a start and an end of an operation of the current source is supplied to a terminal of the current source;
wherein a second control signal for controlling a voltage between terminals of the first transistor is supplied to the first external input terminal,
wherein a third control signal for controlling a voltage between terminals of the second transistor is supplied to the second external input terminal; and
wherein the second control signal and the third control signal are a rectangular wave whose pulse width is half of an oscillating period respectively.

7. The differential oscillation apparatus according to claim 6, wherein emitters of the first transistor and the second transistor are connected in common and bases and collectors are connected to cross each other; and
wherein the first external input terminal and the second external input terminal are provided to a base or a collector of the first transistor or the second transistor respectively.

8. The differential oscillation apparatus according to claim 6, further comprising;
a first control signal generator portion which generates the first control signal and outputs the first control signal to a terminal of the current source;
a second control signal generator portion which generates the second control signal and outputs the second control signal to the first external input terminal; and
a third control signal generator portion which generates the third control signal and outputs the third control signal to the second external input terminal.

9. The differential oscillation apparatus according to claim 7, wherein the first external input terminal is provided to a base of the first transistor;
wherein the second external input terminal is provided to a base of the second transistor; and
wherein the second control signal and the third control signal control base voltages of the first transistor and the second transistor respectively.

10. The differential oscillation apparatus according to claim 6, wherein the second control signal and the third control signal are signals that exist in a rising period of the first control signal respectively.

11. The differential oscillation apparatus according to claim 1, wherein the first control signal is a signal that controls at least once or more a start and an end of an operation of the current source.

12. The differential oscillation apparatus according to claim 2, wherein the differential oscillator portion has a resonance circuit connected to collectors of the first transistor and the second transistor.

13. The differential oscillation apparatus according to claim 1, wherein the differential oscillator portion oscillates in response to a voltage level and a pulse width of the first control signal.

14. The differential oscillation apparatus according to claim 1, wherein the second control signal and the third control signal are a sinusoidal wave or a cosine wave whose period is equal to an oscillating period respectively.

15. The differential oscillation apparatus according to claim 1,
wherein the external input terminal is provided to an emitter of the first transistor or the second transistor; and
wherein the second control signal is a signal that controls collector currents of the first transistor and the second transistor.

16. A differential oscillation apparatus, comprising:
a differential oscillator portion which includes a first transistor and a second transistor, one terminals of which are connected in common and other two terminals of which are connected to cross each other and terminals of which connected in common are connected to a current source;
two output terminals;
a first external input terminal which is provided to any one of terminals of the first transistor; and
a second external input terminal which is provided to any one of terminals of the second transistor,
wherein a first control signal for controlling a start and an end of an operation of the current source is supplied to a terminal of the current source;
wherein a second control signal for controlling a voltage between terminals of the first transistor is supplied to the first external input terminal;
wherein a third control signal for controlling a voltage between terminals of the second transistor is supplied to the second external input terminal;
wherein the first external input terminal is provided to an emitter of the first transistor;

wherein the second external input terminal is provided to an emitter of the second transistor; and wherein the second control signal and the third control signal control collector currents of the first transistor and the second transistor respectively.

17. The differential oscillation apparatus according to claim 1, further comprising:

a current/voltage converter circuit which supplies a current signal to a terminal connected in common, in response to the second control signal.

18. A modulator, comprising:

a differential oscillation apparatus, comprising:

a differential oscillator portion which includes a first transistor and a second transistor, one terminals of which are connected in common and other two terminals of which are connected to cross each other and the one terminals of which connected in common are connected to a current source;

two output terminals;

an external input terminal which is provided to a terminal of either of the first transistor and the second transistor;

a first control signal generator portion which generates a first control signal and outputs the first control signal to a terminal of the current source; and a second control signal generator portion which generates a second control signal and outputs the second control signal to the external input terminal, wherein the first control signal for controlling a start and an end of an operation of the current source is supplied to the terminal of the current source;

wherein the second control signal for controlling a voltage between terminals of the first transistor and the second transistor is supplied to the external input terminal; and a transmitting signal generator portion which generates a transmitting signal as transmission data and outputs the transmitting signal to the first control signal generator portion and the second control signal generator portion, wherein the first control signal generator portion and the second control signal generator portion generate the first control signal and the second control signal in response to the transmitting signal respectively; and wherein the differential oscillation apparatus outputs a modulated signal that is generated by modulating the transmitting signal.

19. A modulator comprising:

a differential oscillation apparatus, comprising:

a differential oscillator portion which includes a first transistor and a second transistor, one terminals of which are connected in common and other two terminals of which are connected to cross each other and the one terminals of which connected in common are connected to a current source;

two output terminals; and an external input terminal which is provided to a terminal of either of the first transistor and the second transistor, wherein a first control signal for controlling a start and an end of an operation of the current source is supplied to a terminal of the current source; and wherein a second control signal for controlling a voltage between terminals of the first transistor and the second transistor is supplied to the external input terminal;

an output selection switch portion which selects either of oscillation outputs having a different phase respectively from the differential oscillator portion; and a transmitting signal generator portion which generates a transmitting signal as transmission data and outputs the transmitting signal to the output selection switch portion, wherein the output selection switch portion selects an oscillation output from the differential oscillator portion in response to the transmitting signal; and wherein the differential oscillation apparatus outputs a modulated signal that is generated by modulating the transmitting signal.

20. The modulator according to claim 19, further comprising;

a comparator circuit which compares the transmitting signal with a predetermined threshold value to control the output selection switch portion; and an OR logical circuit which applies a logical sum operation to the transmitting signal, wherein the transmitting signal generator portion outputs the transmitting signal to the first control signal generator portion and the second control signal generator portion via the OR logical circuit.

21. The differential oscillation apparatus according to claim 6, wherein the first control signal is a signal that controls at least once or more a start and an end of an operation of the current source.

22. The differential oscillation apparatus according to claim 7, wherein the differential oscillator portion has resonance circuit connected to collectors of the first transistor and the second transistor.

23. The differential oscillation apparatus according to claim 6, wherein the differential oscillator portion oscillates in response to a voltage level and a pulse width of the first control signal.

24. The differential oscillation apparatus according to claim 6, wherein the second control signal and the third control signal are a sinusoidal wave or a cosine wave whose period is equal to an oscillating period respectively.

25. A modulator, comprising:

a differential oscillation apparatus, comprising:

a differential oscillator portion which includes a first transistor and a second transistor, one terminals of which are connected in common and other two terminals of which are connected to cross each other and terminals of which connected in common are connected to a current source;

two output terminals;

a first external input terminal which is provided to any one of terminals of the first transistor;

a second external input terminal which is provided to any one of terminals of the second transistor;

a first control signal generator portion which generates a first control signal and outputs the first control signal to a terminal of the current source;

a second control signal generator portion which generates a second control signal and outputs the second control signal to the first external input terminal; and a third control signal generator portion which generates a third control signal and outputs the third control signal to the second external input terminal, wherein the first control signal for controlling a start and an end of an operation of the current source is supplied to the terminal of the current source;

wherein the second control signal for controlling a voltage between terminals of the first transistor is supplied to the first external input terminal, wherein the third control signal for controlling a voltage between terminals of the second transistor is supplied to the second external input terminal; and a transmitting signal generator portion which generates a transmitting signal as transmission data and outputs the transmitting signal to the first control signal generator portion and the second control signal generator portion, wherein the first control signal generator portion and the second control signal generator portion generate the first control signal and the second control signal in response to the transmitting signal respectively; and wherein the differential oscillation apparatus outputs a modulated signal that is generated by modulating the transmitting signal.

26. A modulator, comprising:
a differential oscillation apparatus, comprising:
- a differential oscillator portion which includes a first transistor and a second transistor, one terminals of which are connected in common and other two terminals of which are connected to cross each other and terminals of which connected in common are connected to a current source;
- two output terminals;
- a first external input terminal which is provided to any one of terminals of the first transistor; and
- a second external input terminal which is provided to any one of terminals of the second transistor,
- wherein a first control signal for controlling a start and an end of an operation of the current source is supplied to a terminal of the current source;
- wherein a second control signal for controlling a voltage between terminals of the first transistor is supplied to the first external input terminal; and
- wherein a third control signal for controlling a voltage between terminals of the second transistor is supplied to the second external input terminal;

an output selection switch portion which selects either of oscillation outputs having a different phase respectively from the differential oscillator portion; and a transmission signal generator portion which generates a transmitting signal as transmission data and outputs the transmitting signal to the output selection switch portion, wherein the output selection switch portion selects an oscillation output from the differential oscillator portion in response to the transmitting signal; and wherein the differential oscillation apparatus outputs a modulated signal that is generated by modulating the transmitting signal.

27. The modulator according to claim 26, further comprising:

a comparator circuit which compares the transmitting signal with a predetermined threshold value to control the output selection switch portion; and an OR logical circuit which applies a logical sum operation to the transmitting signal, wherein the transmitting signal generator portion outputs the transmitting signal to the first control signal generator portion and the second control signal generator portion via the OR logical circuit.

* * * * *